(12) United States Patent
Hane

(10) Patent No.: US 6,982,585 B2
(45) Date of Patent: Jan. 3, 2006

(54) PULSE SHAPING SYSTEM, LASER PRINTER, PULSE SHAPING METHOD AND METHOD OF GENERATING SERIAL VIDEO DATA FOR LASER PRINTER

(75) Inventor: Kiyoji Hane, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/357,494

(22) Filed: Feb. 4, 2003

(65) Prior Publication Data
US 2003/0151434 A1   Aug. 14, 2003

(30) Foreign Application Priority Data
Feb. 5, 2002   (JP) ............... 2002-028619

(51) Int. Cl.
*G11C 8/00* (2006.01)
(52) U.S. Cl. .................... 327/277; 327/261
(58) Field of Classification Search ............ 327/261, 327/263, 276, 277, 284, 100, 278, 165–166
See application file for complete search history.

(56) References Cited

U.S. PATENT DOCUMENTS

| | | | | |
|---|---|---|---|---|
| 4,604,582 A | * | 8/1986 | Strenkowski et al. | 327/147 |
| 4,800,304 A | * | 1/1989 | Takeuchi | 327/279 |
| 5,272,390 A | * | 12/1993 | Watson, Jr. et al. | 327/141 |
| 5,589,788 A | * | 12/1996 | Goto | 327/276 |
| 5,889,436 A | * | 3/1999 | Yeung et al. | 331/2 |
| 6,175,605 B1 | * | 1/2001 | Chi | 375/371 |
| 6,314,052 B2 | * | 11/2001 | Foss et al. | 365/233 |
| 6,359,483 B1 | * | 3/2002 | Watkins et al. | 327/158 |
| 6,390,579 B1 | * | 5/2002 | Roylance et al. | 347/9 |

FOREIGN PATENT DOCUMENTS

| JP | 63-016710 A | 1/1988 |
|---|---|---|
| JP | 03-119860 A | 5/1991 |
| JP | 03-279976 A | 12/1991 |
| JP | 05-96780 | 4/1993 |
| JP | 10-126234 | 5/1998 |
| JP | 2000-029424 | 1/2000 |
| JP | 2001-18445 A | 1/2001 |
| JP | 2001-177386 A | 6/2001 |

\* cited by examiner

*Primary Examiner*—Dinh T. Le
(74) *Attorney, Agent, or Firm*—Sughrue Mion, PLLC

(57) ABSTRACT

High-resolution serial data can be obtained by using a costly, large-scale high-performance IC. A high resolution can be achieved without using any high-performance PLL or the like by a low-cost, simple system capable of generating a fundamental waveform on the basis of serial data synchronous with the leading and the trailing edges of a clock signal, of generating a delayed clock signals of a plurality of times by a delay device, and of superposing the fundamental waveform and the delayed clock signals.

8 Claims, 25 Drawing Sheets

| VD[7:2] | videopwm |
|---|---|
| 0000XX | |
| 0001XX | |
| 0010XX | |
| 0011XX | |
| 0100XX | |
| 0101XX | |
| 0110XX | |
| 0111XX | |
| 1000XX | |
| 1001XX | |
| 1010XX | |
| 1011XX | |
| 1100XX | |
| 1101XX | |
| 1110XX | |
| 11110X,11110 | |
| 111111 | |

FIG. 9

| VD[7:2] | videopwm |
|---|---|
| 0000XX | |
| 0001XX | |
| 0010XX | |
| 0011XX | |
| 0100XX | |
| 0101XX | |
| 0110XX | |
| 0111XX | |
| 1000XX | |
| 1001XX | |
| 1010XX | |
| 1011XX | |
| 1100XX | |
| 1101XX | |
| 1110XX | |
| 11110X,11110 | |
| 111111 | |

FIG. 10

| VD[7:2] | videopwm |
|---|---|
| 0000XX | |
| 0001XX | |
| 0010XX | |
| 0011XX | |
| 0100XX | |
| 0101XX | |
| 0110XX | |
| 0111XX | |
| 1000XX | |
| 1001XX | |
| 1010XX | |
| 1011XX | |
| 1100XX | |
| 1101XX | |
| 1110XX | |
| 11110X,11110 | |
| 111111 | |

FIG. 11

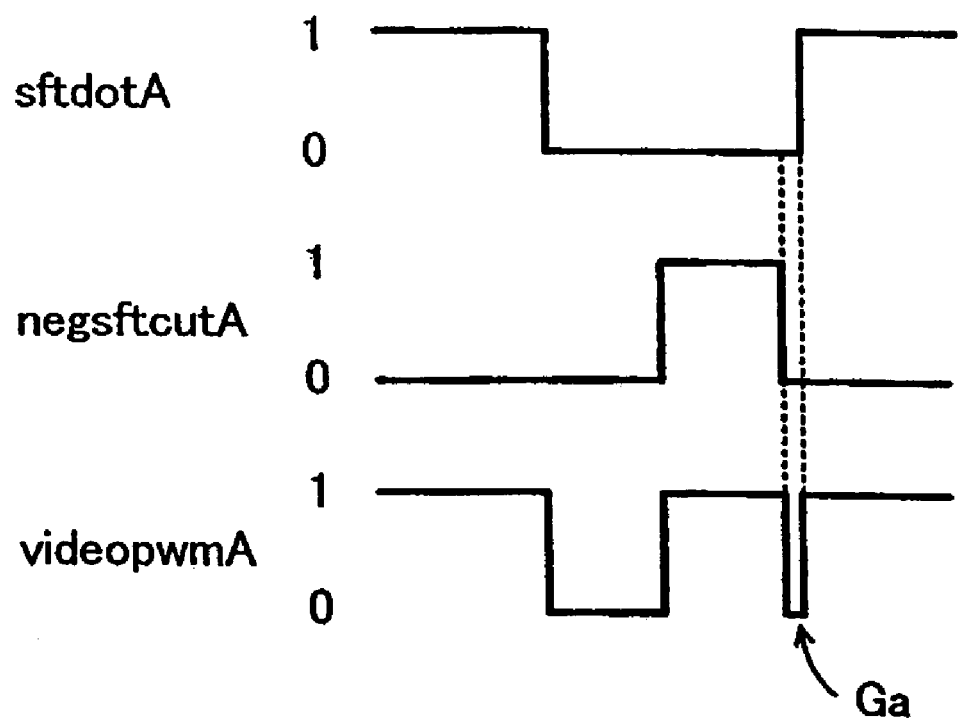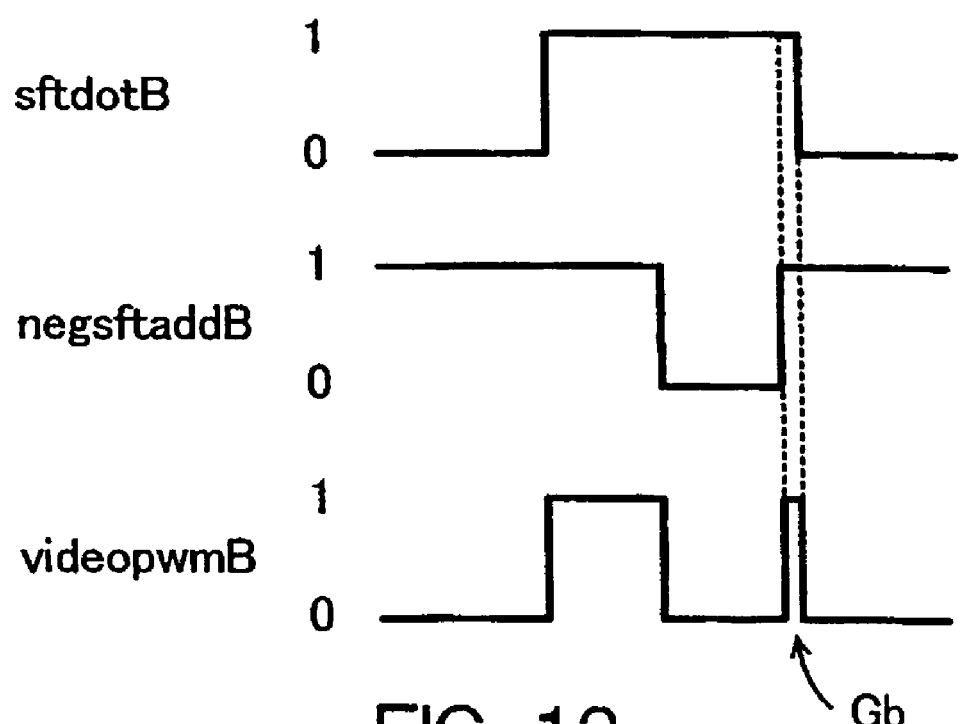
FIG. 12

| Data structure | VD[4:2] | WAVESEL |
|---|---|---|
| Fig.3 | 001 | 001000 |
| | 010 | 010000 |
| | 011 | 100000 |
| | 101 | 000001 |
| | 110 | 000010 |
| | 111 | 000100 |
| Fig.4 | 001 | 100000 |
| | 010 | 010000 |
| | 011 | 001000 |
| | 101 | 000100 |
| | 110 | 000010 |
| | 111 | 000001 |

| Data structure | VD[5:2] | WAVESEL |
|---|---|---|
| Fig.5 | 0001 | 100000 |
| | 0010 | 010000 |
| | 0011 | 001000 |
| | 0101 | 001000 |
| | 0110 | 010000 |
| | 0111 | 100000 |
| | 1001 | 000100 |
| | 1010 | 000010 |
| | 1011 | 000001 |
| | 1101 | 000001 |
| | 1110 | 000010 |
| | 1111 | 000100 |

FIG. 17

Data structure (Fig. 3)

| VD[7:4] | addvideosel |
|---|---|
| 0000 | |
| 0001 | |
| 0010 | |
| 0011 | |
| 0100 | |
| 0101 | |
| 0110 | |
| 0111 | |
| 1000 | |
| 1001 | |
| 1010 | |
| 1011 | |
| 1100 | |
| 1101 | |
| 1110 | |
| 1111 | |

FIG. 18

Data structure (Fig. 4)

| VD[7:4] | addvideosel |
|---|---|
| 0000 | |
| 0001 | |
| 0010 | |
| 0011 | |
| 0100 | |
| 0101 | |
| 0110 | |
| 0111 | |
| 1000 | |
| 1001 | |
| 1010 | |
| 1011 | |
| 1100 | |
| 1101 | |
| 1110 | |
| 1111 | |

FIG. 19

Data structure (Fig. 5)

| VD[7:4] | addvideosel |
|---|---|
| 0000 | |
| 0001 | |
| 0010 | |
| 0011 | |
| 0100 | |
| 0101 | |
| 0110 | |
| 0111 | |
| 1000 | |
| 1001 | |
| 1010 | |
| 1011 | |
| 1100 | |
| 1101 | |
| 1110 | |
| 1111 | |

FIG. 20

PULSE SHAPING SYSTEM, LASER PRINTER, PULSE SHAPING METHOD AND METHOD OF GENERATING SERIAL VIDEO DATA FOR LASER PRINTER

BACKGROUND OF THE INVENTION

1. Field of the Invention

The present invention relates to a pulse shaping system, a laser printer, a pulse shaping method and a method of generating serial video data for a laser printer. More particularly, the present invention relates to a pulse shaping system suitable for generating video signals for a laser printer, a laser printer, a pulse shaping method and a method of generating serial video data for a laser printer.

2. Description of the Prior Art

Previously disclosed technique for enabling a laser printer to print pictures in high picture quality controls the output of a laser at a resolution higher than that of a printer engine. The technique provides serial data of a resolution higher than 1 bit for one dot provided by a printer engine, and controls the output of the laser using the serial data of high resolution to print one dot in a delicate tone. The high-resolution serial data is generated by a pulse shaping system and has a resolution higher than a predetermined video clock. For example, a resolution on the order of 1/64 is required when the resolution of a printer engine is 600 dpi to print pictures in a satisfactory picture quality by a color laser printer.

The aforesaid prior art technique needs a high-frequency clock generating circuit capable of generating a clock signal of, for example, 1344 MHz (672 MHz when both the leading and the trailing edge are used) to achieve a high resolution of 1/64 for a video clock signal of 21 MHz. Conventionally, a high-performance modulation IC that modulates frequency by frequency division using a PLL or the like is used. This modulation IC, however, is an expensive large-scale circuit.

SUMMARY OF THE INVENTION

The present invention has been made in view of the foregoing circumstances and it is therefore an object of the present invention to provide a low-cost pulse shaping system of a simple configuration capable of achieving a necessary resolution, a laser printer, a pulse shaping method and a method of generating serial video data for a laser printer.

According to a first aspect of the present invention, a pulse shaping system comprises: a first parallel-to-serial converting unit capable of being triggered for operation by the leading edge or the trailing edge of a predetermined clock signal to convert first parallel data into an initial serial data pulse; a second parallel-to-serial converting unit capable of being triggered for operation by the trailing edge of the clock signal if the first parallel-to-serial converting unit is triggered by the leading edge of the clock signal or by the leading edge of the clock signal if the first parallel-to-serial converting unit is triggered by the trailing edge of the clock signal to convert second parallel data into a pulse width adjusting serial data pulse; a pulse width adjusting unit for adjusting the width of the initial serial data pulse between at least one of the edges of the initial serial data pulse and the edge of the pulse width adjusting serial data pulse; and a serial data output unit that provides a serial data pulse of a pulse width adjusted by the pulse width adjusting unit.

Since the first and the second parallel-to-serial converting unit are triggered by the different driving edges, the initial serial data pulse provided by the first parallel-to-serial converting unit and the pulse width adjusting serial data pulse provided by the second parallel-to-serial converting unit have edges at different times, respectively. Therefore, in the predetermined clock signal in which a leading edge and a trailing edge appear every half the signal period, a serial data pulse of a pulse width adjusted at half the period of the predetermined clock signal for the initial serial data can be obtained by adjusting the width of the initial serial data pulse between at least one of the edges of the initial serial data pulse and the edge of the pulse width adjusting serial data pulse. This configuration is simple, does not need any high-performance PLL and can be provided at a low cost.

As apparent from the foregoing description, the present invention provides the pulse shaping system and the pulse shaping method capable of easily generating a serial data pulse having an adjusted pulse width adjusted every half the period of the clock signal at a low cost by using the predetermined clock signal in which a leading edge and a trailing edge appear every half the signal period.

The predetermined clock signal may be any pulse signal having a fixed period. The predetermined clock signal may be an oscillatory output provided by a predetermined oscillator or may be a pulse signal obtained by frequency multiplication at a comparatively low multiplication factor by a simple PLL before applying the predetermined clock signal to the first and the second parallel-to-serial converting unit. The first and the second parallel-to-serial converting unit may be any signal converting unit capable of parallel-to-serial conversion, such as shift registers or combinations each of a shift register and other circuits. Since a general synchronizing circuit design uses a leading edge, it is preferable that the components of the circuit are driven by the leading edge.

The pulse width adjusting unit may be capable of adjusting the width of the pulse of one of two pulses between the edges of the two pulses. Preferably, the leading edges of both the two pulses are compared or the trailing edges of the same are compared to avoid deforming the pulse shape by pulse width adjustment. As viewed on high-level basis, a condition where the duration of a high-level part of a pulse is increased by pulse width adjustment may be regarded as pulse addition, and a condition where the duration of a high-level part of a pulse is cut by pulse width adjustment may be regarded as partial pulse deletion. As viewed on low-level basis, a condition where the duration of a low-level part of a pulse is increased by pulse width adjustment may be regarded as pulse addition, and a condition where the duration of a low-level part of a pulse is cut by pulse width adjustment may be regarded as partial pulse deletion.

Any one of those processes adjusts the pulse width of the serial data pulse by adjusting the pulse width between the edges of the two pulses. Either on high-level basis or on low-level basis, pulse width adjustment can be achieved by giving two pulses to a predetermined logic circuit. It is preferable to generate a pulse width adjusting serial data pulse for increasing a pulse with and a pulse width adjusting serial data pulse for deleting part of a pulse width to increase the pulse width and to delete part of the pulse width by the logic circuit.

According to a second aspect of the present invention, a pulse shaping system comprises: a clock signal delaying unit including a plurality of signal delay devices placed in a predetermined clock signal line to obtain delayed pulses at a plurality of delayed times by delaying the leading and the trailing edge of a clock signal; and a delayed pulse gate that passes the delayed pulse of a time specified by a timing signal specifying the time of the delayed pulse.

The delayed pulses can be obtained by delaying the clock signal by the signal delay devices, and serial data produced by adjusting the pulse width of the clock signal in a unit of the delay time of the delayed pulse by combining the delayed pulses and the clock signal.

Thus, a pulse shaping system and a pulse shaping method capable of selecting the delayed pulse delayed by a desired delay time and of adjusting the pulse width of the clock signal in a unit of the delay time can be provided.

The plurality of signal delay devices are used for producing the delayed pulses at the plurality of times delayed by the plurality of delay times, and one of the delayed pulse is specified by the timing signal. Therefore, the delay time of the delayed pulse is not limited even after the formation of the circuit, and a delayed pulse delayed by a desired delay time can be selected. Generally, a delay time determined by a delay device is affected by temperature and device arrangement and it is difficult to determine a delay time positively. Since the present invention is capable of selecting a desired delayed pulse from the plurality of delayed pulses, a delay time most properly meeting the purpose of the delayed pulse obtained by the present invention can be easily selected.

The delay device may be of any type provided that the delay device is capable of delaying a clock signal, such as a buffer, a NOT device, a NAND device, a signal line of a length or a load. The delayed pulse gate may be any gate capable of one of the delayed pulses at the plurality of times, and may be a combination of AND gates that receive a timing signal and a specified delayed pulse or any suitable logic circuit.

The number of selectable delay times can be increased by increasing delay devices when the delayed pulse is thus obtained. Instead of simply increasing the selectable delay times, at least one circuit of the same configuration as the clock signal delaying unit and the delayed pulse gate may be formed as an nth-stage delay circuit (n is a natural number not smaller than 2), the delayed pulse passed the (n−1)th-stage delayed pulse gate may be applied to the clock signal line of the nth-stage delay circuit.

A plurality of delayed pulses can be used by using two or more circuit sets each of the clock signal delaying unit and the delayed pulse gate. For example, when three circuit sets are formed, one nondelayed pulse and a first to a third delayed pulse of different delay times can be obtained. A resolution corresponding to ¼ of a predetermined time period can be realized by delaying the delayed pulses such that the edges of the first to the third delayed pulse are at predetermined time intervals from the edge of the nondelayed pulse. Naturally, the fine adjustment of the delay time of each of the first to the third delayed pulse can be achieved by selecting a desired delayed pulse by each delayed pulse gate. The same number of signal delay devices may be used in all the stages by using the same timing selection signal for all the stages or the stages have different numbers of signal delay devices by using different timing selection signals for the stages.

Thus, the pulse width can be adjusted in a high resolution and, at the same time, the pulses can be shaped.

According to the present invention, a serial data pulse having a pulse width adjusted in a unit of half the period of the predetermined clock signal can be obtained, and a clock signal having a high-resolution edge can easily be obtained. A high-resolution serial data pulse can very easily be obtained by using the combination of those.

According to a third aspect of the present invention, a pulse shaping system comprises: a first parallel-to-serial converting unit capable of being triggered for operation by the leading edge or the trailing edge of a predetermined clock signal to convert first parallel data into an initial serial data pulse; a second parallel-to-serial converting unit capable of being triggered for operation by the trailing edge of the clock signal if the first parallel-to-serial converting unit is triggered by the leading edge of the clock signal or by the leading edge of the clock signal if the first parallel-to-serial converting unit is triggered by the trailing edge of the clock signal to convert second parallel data into a pulse width adjusting serial data pulse; a pulse width adjusting unit for adjusting the width of the initial serial data pulse between at least one of the edges of the initial serial data pulse and the edge of the pulse width adjusting serial data pulse; a serial data output unit that provides a serial data pulse of a pulse width adjusted by the pulse width adjusting unit; an n-stage clock signal delaying unit (n is a natural number) including a plurality of signal delay devices placed in a predetermined clock signal line to obtain delayed pulses at a plurality of delayed times by delaying the leading and the trailing edge of a clock signal; n-stages of delayed pulse gates (n is a natural number) that pass the delayed pulse of a time specified by a timing signal specifying the time of the delayed pulse; a delayed pulse input unit for applying the delayed pulse passed the nth delayed pulse gate to a clock signal line of an (n+1)th clock signal delaying unit; a delay clock selecting unit for selecting a delayed pulse according to a delayed clock selection signal specifying one of the n-stages of delayed pulse gates; and a high-resolution serial data pulse signal output unit for providing a high-resolution serial data pulse formed by adjusting the pulse width of the serial data pulse between at least one of the edges of a serial data pulse provided by the serial data output unit and the edge of the delayed pulse selected by the delay clock selecting unit.

Thus, the serial data pulse having edges at times respectively corresponding to the leading and the trailing edge of the clock signal is generated, the delayed pulse of a resolution higher than the frequency of the clock signal is obtained, and the width of the serial data pulse is adjusted between at least one of the edges of the serial data pulse and the edge of the delayed pulse. Therefore, the pulse width can be adjusted at least at one of the opposite ends of the serial data pulse. Since an incremental or decremental adjustment is dependent on the delayed pulse and the serial data pulse, a high-resolution serial data pulse can be generated by controlling the width of the serial data pulse in a unit corresponding to half the period of the clock signal by a higher resolution.

More concretely, since the serial data pulse uses the leading and the trailing edge of the clock signal, the resolution of the serial data pulse is half the resolution of the clock signal. When the edges of the first to the third delayed pulse lie are in a time interval between the adjacent leading and the trailing edge of the clock signal, a high-resolution serial data pulse is obtained by adjusting the pulse width by a resolution corresponding to ¼ of the time interval. Thus, a data pulse of a resolution equal to ⅛ the resolution of the clock signal can be used. When the present invention is applied to a laser printer, a high-resolution serial data pulse of a resolution equal to 1/64 of the video clock can be generated by a very simple arrangement by dividing the resolution of a video clock by eight by a simple PLL or the like. The configuration can provide the pulse shaping system that permits to obtain high-resolution serial data with no difficulty and at a low-cost.

The high-resolution serial data pulse may be used for adjusting the width of a laser beam in the scanning direction of a laser printer. In a laser printer that determines a tone by forming dots at the frequency of a predetermined video clock, dots can be formed in more delicate tones by specifying the width of the laser beam with respect to the scanning direction by the high-resolution serial data pulses for the dots, in addition to the on/off control of dots. Naturally, high-resolution tone expression may be achieved by the present invention after dividing the video clock beforehand by a simple PLL or the like.

Thus, the laser printer is able to print pictures in a delicate tone in addition to printing dots at desired positions.

The second parallel-to-serial converting unit may be any suitable means capable of being triggered for a parallel-to-serial conversion operation by the edge different from that by which the first parallel-to-serial converting unit is triggered. For example, the second parallel-to-serial converting unit may include a shift register driven by either the leading or the trailing edge, and a flip-flop that latches the output of the shift register and is driven by the leading edge when the shift register is driven by the trailing edge or by the trailing edge when the shift register is driven by the leading edge.

Thus, the second parallel-to-serial converting unit include the shift register capable of carrying out parallel-to-serial conversion, and the flip-flop that latches the output of the shift register and is driven by the leading edge when the shift register is driven by the edge different from that used for driving the shift register. This arrangement enables the shift register to be driven by the edge used for driving the first parallel-to-serial converting unit, and the flip-flop to be driven by the other edge to provide the output of the second parallel-to-serial converting unit. Thus, the circuit can be constructed such that most of the synchronizing circuits are driven by the trailing edge, and only some of the flip-flops are driven by the trailing edge, which facilitates forming the synchronizing circuits.

Thus, the parallel-to-serial converting unit can be easily formed, easily forming the synchronizing circuits by using the same edge for driving most of the circuits.

The pulse width may be adjusted by either the pulse width adjusting unit or the high-resolution serial data pulse signal output unit, or by the combination of the pulse width adjusting unit and the high-resolution serial data pulse signal output unit, and the edge of the pulse to be subjected to width adjustment and the edge of a pulse to be compared may correspond to different times, respectively. The pulse to be subjected to width adjustment is the initial serial data pulse provided by the first parallel-to-serial converting unit or the serial data pulse provided by the serial data output unit. The pulse to be compared is the pulse width adjusting serial data pulse provided by the second parallel-to-serial converting unit or the delayed pulse.

The pulse width adjusting operation is triggered by the leading edge or the trailing edge of the clock signal. Although a glitch occurs when pulses having edges corresponding to the same time are used in combination for pulse addition or deletion, glitch can be avoided by comparing pulses having edges respectively corresponding to different times. For example, a spiked level variation occurs at the edge of a pulse formed by logical OR if logical OR between a pulse and a pulse having a leading edge at time corresponding to that of the trailing edge of the former pulse is carried out, and a spiked level variation occurs at time apart from a pulse generated by deleting a pulse having a leading edge at time corresponding to that of the trailing edge of a pulse from the latter pulse. Such level variations can be avoided.

Thus, glitch can be prevented.

The signal delay device may be any suitable device capable of delaying times when the leading and the trailing edge of a signal appears. For example, the signal delay device is a buffer provided with an even number of inverters. Various devices placed in a signal line can be used as delay devices. The even number of inverters are able to delay a signal and to transmit the signal without inverting the level by the input and output of the signal. Generally, the buffer provided with the inverters and not causing inversion delays the leading edge and the trailing edge by different delays, respectively. Therefore, if a buffer including an odd number of inverters and not causing inversion is used for delaying a signal, the opposite edges of a pulse are changed and the pulse is deformed. When an even number of inverters are used, the leading and the trailing edge of an initial pulse are inverted by the same times and hence the shapes of the opposite edges are maintained.

Thus, the shape of the pulse can be maintained.

The present invention may use a parallel output signal provided by a register that specifies a delayed pulse by setting each of bits to the ON state or the OFF state. When the parallel output signal provided by the register is used, a delayed pulse can easily be specified by turning on and off the bits of the parallel output signal. Since the register may be set so that desired bits are turned on and off, delayed pulses desired by the maker of the pulse shaping system can be selected by storing data specifying on and off of bits in a nonvolatile ROM, an EEPROM or the like. When the register is designed such that bit values can be adjusted by software while a laser printer or the like provided with the pulse shaping system is in operation, the maker of the pulse shaping system is able to select a desired delayed pulse after shipping and the user of the laser printer is able to select a desired delayed pulse.

Thus, a desired delayed pulse can easily be specified, the maker of the pulse shaping system is able to select a desired delayed pulse, and the user is able to select a desired delayed pulse.

The number of the plurality of signal delay devices may be determined such that a time interval between the most delayed signal among those delayed by the plurality of signal delay devices, and a nondelayed signal is $\frac{3}{2}$ of a necessary delay time of the delayed pulse or below. Although the delay time can optionally be increased by increasing the number of signal delay devices, the present invention employs the plurality of signal delay devices because the delay time used by some of the plurality of signal delay devices coincides with the necessary delay time. Signal delay devices that use a very long delay time as compared with the necessary delay time are useless.

The number of signal delay devices that such that makes the time interval between the most delayed signal and the nondelayed signal $\frac{3}{2}$ of the necessary delay time is sufficient. To obtain a high-resolution serial data pulse at a resolution equal to $\frac{1}{4}$ of a certain period, $\frac{1}{4}$ of the period is the necessary delay time of the delayed pulse. It is satisfactory if the edge of the most delayed pulse is within $\frac{3}{8}$ of the period from the edge of the nondelayed pulse. Practically, delay time is affected by temperature and the arrangement of devices and accurate delay time is unknown before assembly. However, a circuit can be formed on the basis of the foregoing standard without using unnecessarily many signal delay devices.

Thus, a necessary and sufficient number of signal delay devices can be determined.

The serial data output unit is able to provide a serial data pulse having edges corresponding to the leading and the trailing edge of the clock signal, and serial video data of a resolution higher than that of the clock signal can be obtained by adjusting the pulse width using the difference between the serial data pulse and the delayed pulse as a unit, and hence the laser printer is able to print pictures of a high definition. As mentioned above, a signal formed by the frequency division of a video clock by a simple PLL or the like may be used as the predetermined clock signal.

It is readily understood that the method of shaping a pulse of a resolution higher than the frequency of a clock signal by the circuits driven by different edges and the delay devices, or the combination of those is not limited in its application to the pulse shaping system and the laser printer and may be used as a method. Modifications of the pulse shaping system and the laser printer may be made. The present invention may be embodied not only in a concrete apparatus but also as a method.

Similarly, the present invention provides a laser printer capable of printing pictures in a high definition, and method of generating serial video data for the laser printer.

BRIEF DESCRIPTION OF THE DRAWINGS

FIG. 9 is a diagrammatic view typically showing videopwm provided for the image data VD;

FIG. 10 is a diagrammatic view typically showing videopwm provided for the image data VD;

FIG. 11 is a diagrammatic view typically showing videopwm provided for the image data VD;

FIG. 12 is a time chart of assistance in explaining causes of glitch;

FIG. 17 is a table showing image data VDs and corresponding WAVESELs;

FIG. 18 is a diagram typically showing addvideosel by way of example;

FIG. 19 is a diagram typically showing addvideosel by way of example;

FIG. 20 is a diagram typically showing addvideosel by way of example;

DESCRIPTION OF THE PREFERRED EMBODIMENTS

Components of preferred embodiments of the present invention will be described in the following order.

Figure 1:
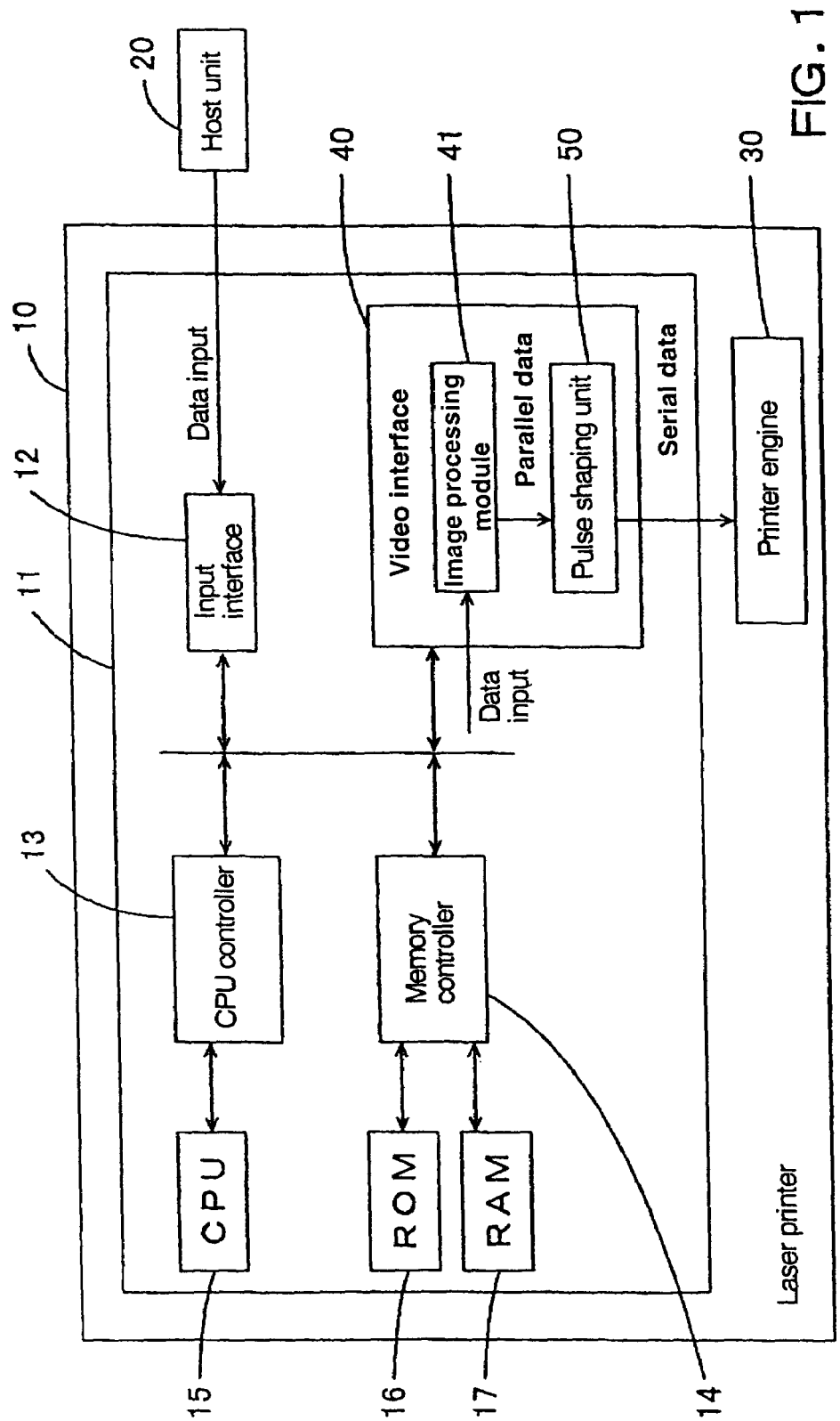
FIG. 1 is a block diagram of a laser printer.

(1) Laser Printer
(2) Pulse Shaping System
(3) Fundamental Waveform Generating Circuit
(4) Delayed Waveform Generating Circuit
(5) High-resolution Serial Data Generating Circuit
(5) Pulse Shaping Operation
(1) Laser Printer Referring to FIG. 1 showing a laser printer 10 provided with a pulse shaping system according to the present invention in a block diagram, the laser printer 10 includes a data processing system 11 for data processing, and a printer engine 30, i.e., a mechanical unit, that performs operations for emitting a laser beam and scanning a recording sheet. The data processing system 11 processes input data given thereto by a host unit 20, such as a personal computer, and provides image data corresponding to the input data. A video I/F 40 converts the image data and gives converted image data to the printer engine 30. The printer engine 30 prints characters and graphic images on recording sheets on the basis of the converted image data provided by the video I/F 40. The printer engine 30 emits a laser beam, varies the width of the laser beam for printing dots and scans the surface of a photoconductive drum to irradiate the surface of the photoconductive drum with the laser beam.

The input data given to the data processing system 11 is parallel data is parallel data. The data processing system 11 generates parallel image data corresponding to widths with respect to a scanning direction of the laser beam for pixels. The pulse shaping system according to the present invention is provided with the video I/F 40. The video I/F generates serial image data and gives the same to the printer engine 30. Therefore, the data processing system 11 includes an input I/F 12, a CPU controller 13, a memory controller 14, the video I/F 40, a CPU 15 connected to the CPU controller 13, a ROM 16, and a RAM 17. The input I/F 12, the CPU controller 13, the memory controller 14 and the video I/F 40 are connected to a bus. The ROM 16 and the RAM 17 are connected to the memory controller 14.

The input I/F 12 is a bidirectional parallel interface interconnecting the laser printer 10 and the host unit 20. The ROM 16 includes a program ROM storing programs, and a font ROM storing fonts. The program ROM stores a printing program for interpreting input data provided by the host unit 20 and converting the same into image data, an IPL (initial program loader) and such. The font ROM stores bit map data on fonts for converting input data into image data.

The CPU 15 uses the RAM 17 as a work area, and carries out operations according to the printing program stored in the ROM 16. The RAM 17 serves as a work area when the CPU 15 converts the input data into the image data and serves as an image buffer for storing intermediate data produced during operations for converting the input data into the image data. The image data VD is parallel data representing tones of dots, i.e., the widths of the laser beam with respect to the scanning direction. The video I/F 40 generates the image data.

The principal operations of the data processing system 11 may be carried out by application programs which are used by the host unit 20. The host unit 20 may be any one of various devices, such as a digital camera instead of the personal computer. The configuration of the data processing system 11 is not limited to the foregoing configuration; a USB interface may be used instead of the parallel interface as the input I/F 12. When a USB interface is employed, a USB controller converts serial data given thereto by the host unit 20 into corresponding parallel data and provides the parallel data on the bus. Thus, the video I/F executes parallel-to-serial conversion.

The video I/F 40 includes an image processing module 41 and a pulse shaping unit 50. The image processing module 41 receives the input data through the bus directly from the input I/F 12, processes the input data for a color adjustment process and a smoothing process, generates the parallel data VD indicating the widths of the laser beam with respect to the scanning direction, converts the parallel VD into predetermined parallel data and provides the parallel data. The parallel data is loaded to the pulse shaping unit 50 to generate high-resolution serial data. The image processing module 41 generates and provides various parallel data. The pulse shaping unit 50 generates and provides serial data on dots corresponding to the widths of the laser beam with respect to the scanning direction specified by the parallel data VD on the basis of input parallel data given thereto by the image processing module 41 and a video clock of a predetermined frequency. The serial data provided by the pulse shaping unit 50 specifies a tone in a resolution of 1/64 for each dot. In this embodiment, the pulse shaping unit 50 forms a pulse shaping system according to the present invention.

(2) Pulse Shaping System

Figure 2:
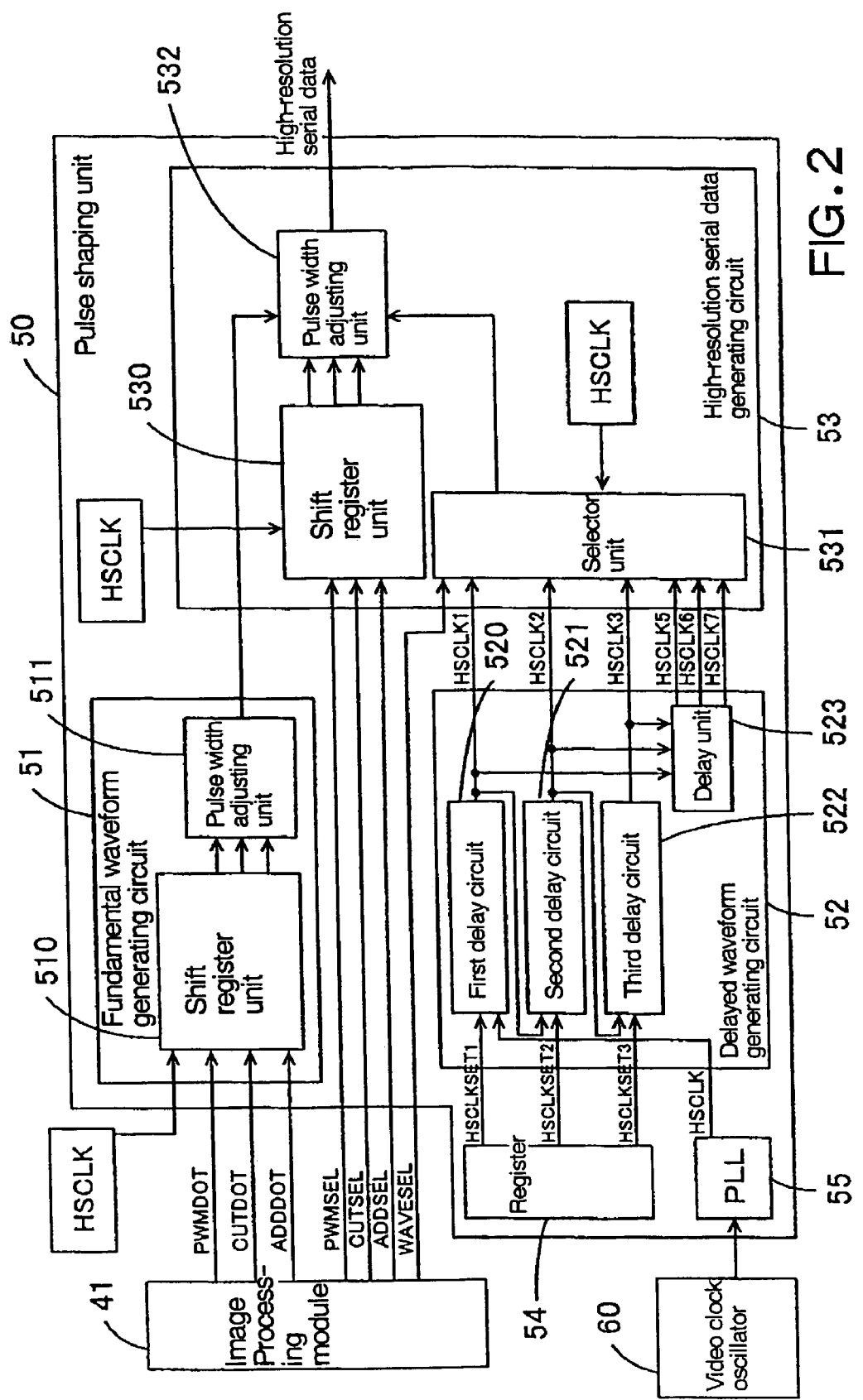
FIG. 2 is a block diagram of a pulse shaping unit.

The configuration of the pulse shaping unit 50 will be described with reference to FIG. 2 showing the pulse shaping unit 50 in a block diagram. Referring to FIG. 2, the pulse shaping unit 50 includes a fundamental waveform generating circuit 51, a delayed waveform generating circuit 52, a high-resolution serial data generating circuit 53, a register 54, and a PLL circuit 55. The PLL circuit 55 receives an oscillating signal of 21 MHz from the video clock oscillator 60 and provides a signal obtained by multiplying the frequency of the oscillating signal by eight. The PLL circuit 55 provides a clock signal HSCLK of 168 MHz. The clock signal HSCLK has a leading edge and a trailing edge in half a period. The image processing module 41 converts the parallel data VD and provides parallel data PWMDOT, CUTDOT, ADDDOT, PWMSEL, CUTSEL, ADDSEL and WAVESEL. Those parallel data PWMDOT, CUTDOT and ADDDOT are given to the fundamental waveform generating circuit 51, and those parallel data PWMSEL, CUTSEL, ADDSEL and WAVESEL are given to the high-resolution serial data generating circuit 53. The signals will be described later.

The fundamental waveform generating circuit 51 includes a shift register unit 510 and a pulse width adjusting unit 511.

The shift register unit 510 includes three shift registers for converting the parallel data into initial serial data pulses and pulse width adjusting serial data pulses. Each of the shift registers is driven by the leading edge of the clock signal HSCLK. The two outputs of them are connected to a flip-flop driven by the trailing edge of the clock signal HSCLK. Thus, one of those three shift register provides an output signal having edges that appear in synchronism with the leading edges of the clock signal HSCLK, and the other two shift resisters and the flip-flop provide output signals having edges that appear in synchronism with the trailing edges of the clock signal HSCLK.

The shift register unit 510 generates initial serial data pulses in synchronism with the leading edges of the clock signal HSCLK, and pulse width adjusting serial data pulses in synchronism with the trailing edges of the clock signal HSCLK. Those pulses generated by the shift register unit 510 are given to the pulse width adjusting unit 511. The pulse width adjusting unit 511 combines those pulses to provide a serial data pulse videopwm. The pulse width adjusting unit 511 comprises a logic circuit. The pulse width adjusting unit 511 adjusts the width of the initial serial data pulse in a time period between the respective edges of the initial serial data pulse provided by the shift register unit 510 and the pulse width adjusting serial data pulse, and provides the initial serial data pulse having an adjusted pulse width. The fundamental wave shape generating circuit 51 is capable of providing serial data pulses having edges at optional positions in a unit equal to half the period of the clock signal HSCLK by adjusting the parallel data PWMDOT, CUTDOT and ADDDOT. In FIG. 2, the arrow extending from a block denoted by HSCLK to the shift register unit 510 indicates that the output signal of the PLL circuit 55 is given to the shift register unit 510.

The delayed waveform generating circuit 52 includes a first delay circuit, a second delay circuit 521, a third delay circuit 522, and a delay unit 523. The register 54 of the pulse shaping unit 50 is loaded with a parallel data for selecting delayed pulses provided by the delay circuits 520 to 522. The register 54 gives the parallel data to the delay circuits 520 to 522. In this embodiment, the delayed pulses and the parallel data to be loaded to the register 54 are determined beforehand for the laser printer 10 before shipping. The parallel data stored in the ROM 16 is loaded to the register 54 before the laser printer is started. Thus, the manufacturer of the laser printer 10 is able to select the delayed pulses optionally, and the special delayed pulses are used when the laser printer 10 is started. The data to be loaded to the register 54 may be changeable during the start of the laser printer 10 to enable the user select desired delayed pulses.

The data loaded to the register 54 are HSCLKSET1 to HSCLKSET3 shown in FIG. 2. The values of HSCLKSET1 to HSCLKSET3 may be the same so as to make delay times provided by the delay circuits 520 to 522 the same. Each of the delay circuits 520 to 522 includes a plurality of delay devices. The delay circuits 520 to 522 passes some of a plurality of delay time signals selectively according to gates specified by the data loaded to the register 54. Thus, the delay circuits 520 to 522 are able to delay output signals by desired delay times specified by the data loaded to the register 54 with respect to input signals given thereto. In this embodiment, the delay devices of the delay circuits 520 to 522 are substantially the same, and the delay circuits 520 to 522 are able to provide substantially the same delay times. In this embodiment, the register 54 corresponds to the delay clock selecting unit.

Different input signals are given to the first delay circuit 520, the second delay circuit 521 and the third delay circuit 522, respectively, and the first delay circuit 520, the second delay circuit 521 and the third delay circuit 522 provide different output signals, respectively; the clock signal HSCLK is given to the first delay circuit 520, the output signal of the first delay circuit 520 is given to the second delay circuit 521, and the output signal of the second delay circuit 521 is given to the third delay circuit 522. The first delay circuit 520 provides a delayed pulse signal HSCLK1 delayed by a predetermined delay time with respect to the clock signal HSCLK, the second delay circuit 521 provides a delayed pulse signal HSCLK2 delayed by a delay time with respect to the delayed pulse signal HSCLK1, and the third delay circuit 522 provides a delayed pulse signal HSCLK3 delayed by a delay time with respect to the delayed pulse signal HSCLK2.

The delayed pulse signals HSCLK1 to HSCLK3 are given to the delay unit 523 and the high-resolution serial data generating circuit 53. The delay unit 523 provides delayed pulse signals HSCLK5, HSCLK6 and HSCLK7 delayed by a delay time corresponding to half the period of the clock signal HSCLK with respect to the input delayed pulse signals HSCLK1 to HSCLK3. Since the respective periods of the delayed pulse signals HSCLK1 to HSCLK7 are equal to the period of the clock signal HSCLK, the function of the delay unit 523 is equivalent to the inversion of the input delayed pulse signals HSCLK1 to HSCLK3. The delayed pulse signals HSCLK5, HSCLK6 and HSCLK7 are delayed by a delay time corresponding to half the period of the clocks signal HSCLK with respect to the delayed pulse signals HSCLK1, HSCLK2 and HSCLK3, respectively. The delay unit 523 may be of any suitable circuit configuration provided that the delay unit 523 is capable of delaying the input signals by a delay time corresponding to half the period of the clock signal HSCLK. For example, the input signal may be delayed by adjusting the length of a signal line to adjust time for transmitting the input signal through the signal line or by placing a proper load in the signal line.

The first delay circuit 520 delays the output signal by a delay time corresponding to ¼ of half the period of the clock signal HSCLK with respect to the input signal. The data HSCLKSET1 is used for fine adjustment. The second delay circuit 521 delays the output signal further by a delay time corresponding to ¼ of half the period of the clock signal HSCLK. Thus, the output signal of the second delay circuit 521 is delayed by a delay time corresponding to ½ of half the period of the clock signal HSCLK with respect to the input signal. Similarly, the third delay circuit 522 delays the output signal by a delay time corresponding to ¾ of half the period of the clock signal HSCLK. Thus, the output pulse signals HSCLK5 to HSCLK7 are delayed by delay times corresponding to ⁵⁄₄, ³⁄₂, ⁷⁄₄ of half the period of the clock signal HSCLK, respectively.

The high-resolution serial data generating circuit 53 includes a shift register unit 530, a selector unit 531 and a pulse width adjusting unit 532. The shift register unit 530 is similar in construction to the shift register unit 510. Input signals to the shift register unit 530 are PWMSEL, CUTSEL and ADDSEL, which are different from those given to the shift register 510. Thus, the shift register unit 530 is able to generate pulse signals having edges at times shifted by half the period of the clock signal HSCLK from those of the clock signal HSCLK regardless of the patterns of the output serial data pulse signals of the shift register unit 510.

The pulse width adjusting unit 532 has a circuit configuration partly similar to that of the pulse width adjusting unit 511 and is additionally provided with a delayed pulse adding circuit for adding a delayed pulse signal generated by the delayed waveform generating circuit 52 to a serial data pulse signal generated by the fundamental waveform generating circuit 51. A pulse signal generated by the shift register unit 530 is given to the part of the pulse width adjusting unit 532 of the same circuit configuration similar to that of the pulse width adjusting unit 511. The width of one of those pulse signals is adjusted to provide a timing serial data pulse signal having a pulse width adjusted in a unit corresponding to half the period of the clock signal HSCLK.

The timing serial data pulse signal specifies a time range in which the pulse width adjusting unit 532 carries out a pulse width adjusting process. A delayed pulse signal provided by the delayed waveform generating circuit 52 is obtained by delaying the clock signal HSCLK and has a stream of pulses arranged at a fixed period. Therefore, proper pulses can be extracted from the delayed pulse signal and the extracted pulse can be combined by specifying the time range in which the pulse width adjusting process is carried out by the pulse width adjusting unit 532.

The selector unit 531 selects one of delayed pulse signals generated by the delayed waveform generating circuit 52 on the basis of a signal WAVESEL provided by the image processing module 41. The selector unit 531 is provided with a register for storing the signal WAVESEL, and a gate that passes one of the output signals of the delayed waveform generating circuit 52 according to its bit. Thus, the selector unit 531 provides one of the delayed pulse signals according to the contents of the signal WAVESEL.

The pulse width adjusting unit 532 extracts a pulse signal in a predetermined time period by the timing serial data pulse from the delayed pulse signal. The pulse width adjusting unit 532 adjusts the pulse width of the serial data pulse signal in a time between the respective edges of the extracted pulse signal and the output signal (serial data pulse signal) of the fundamental waveform generating circuit 51. Thus, the pulse width can be adjusted in a unit corresponding to ¼ of half the period of the clock signal HSCLK; that is a high-resolution serial data pulse signal having a pulse width adjusted in a high resolution using the output serial data pulse signal of the fundamental waveform generating circuit 51 as a fundamental waveform. The pulse width adjusting unit 532 corresponds to the high-resolution serial data pulse signal output unit.

Thus, the pulse shaping unit 50 is able to provide the high-resolution serial data on the basis of the output signals WMDOT, CUTDOT, ADDDOT, PWMSEL, CUTSEL, ADDSEL and WAVESEL. A video clock signal generated by a video clock oscillator 60 is converted into the clock signal HSCLK having a period equal to ⅛ of the period, and the fundamental waveform generating circuit 51 the serial data pulse signal having a pulse width capable of being varied every half the period of the clock signal HSCLK. Thus, high-resolution serial data having pulse width capable of being varied in a resolution corresponding to ¹⁄₆₄ of the period of the video clock signal can be generated by combing the serial data pulse signal and the delayed pulse signal.

In this embodiment, the period of the video clock signal corresponds to a period capable of specifying the tone of a dot. Each dot can be formed in one of sixty-four tones by generating the serial data having a resolution corresponding to ¹⁄₆₄ of the period of the video clock signal. This embodiment represents the tone of a dot by a 6-bit data. Predetermined six digits of parallel data VD specify a tone.

Figure 3:
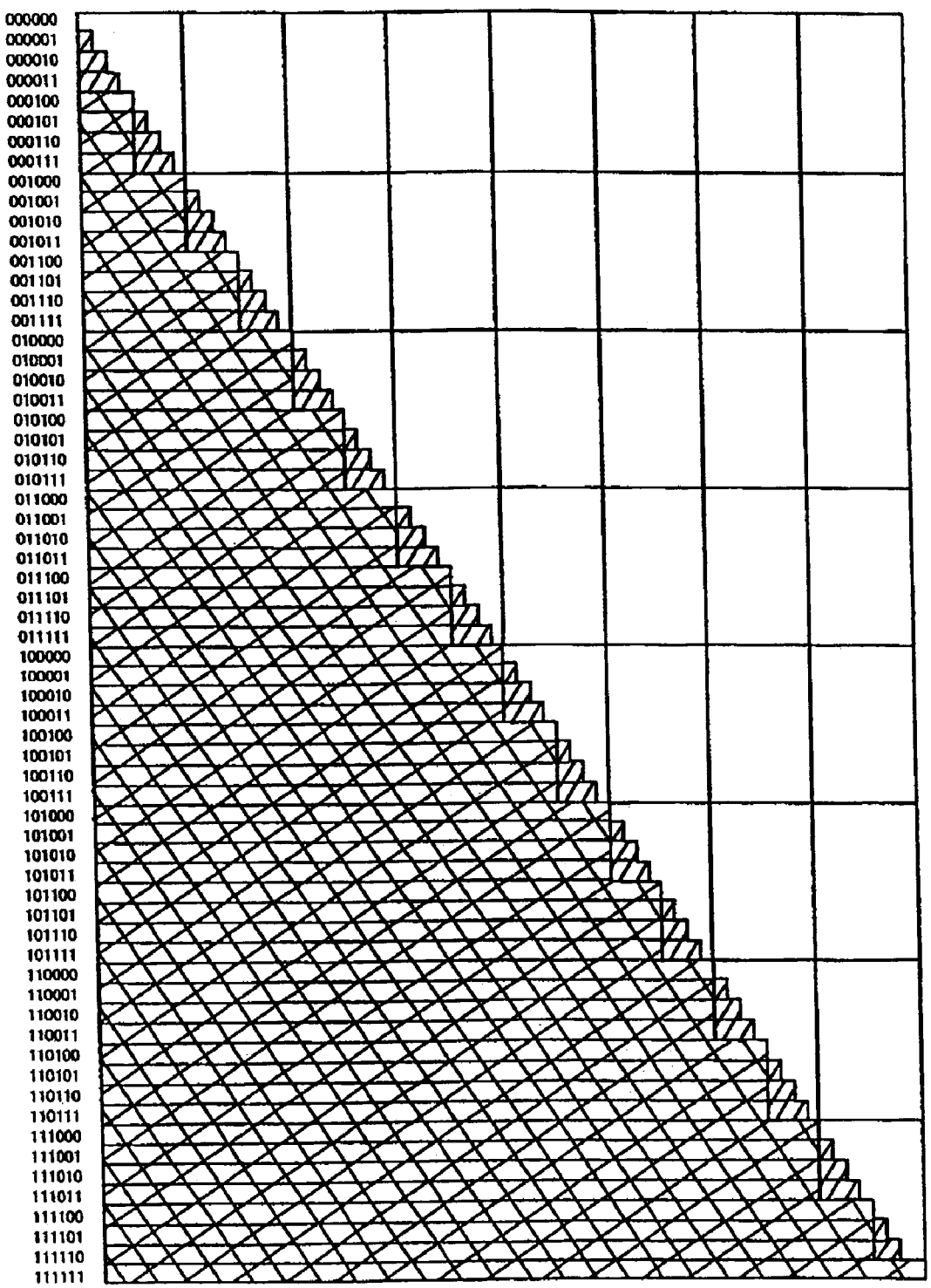
FIG. 3 is diagrammatic view showing the relation between image data VD and a high-resolution serial data pulse.
Figure 4:
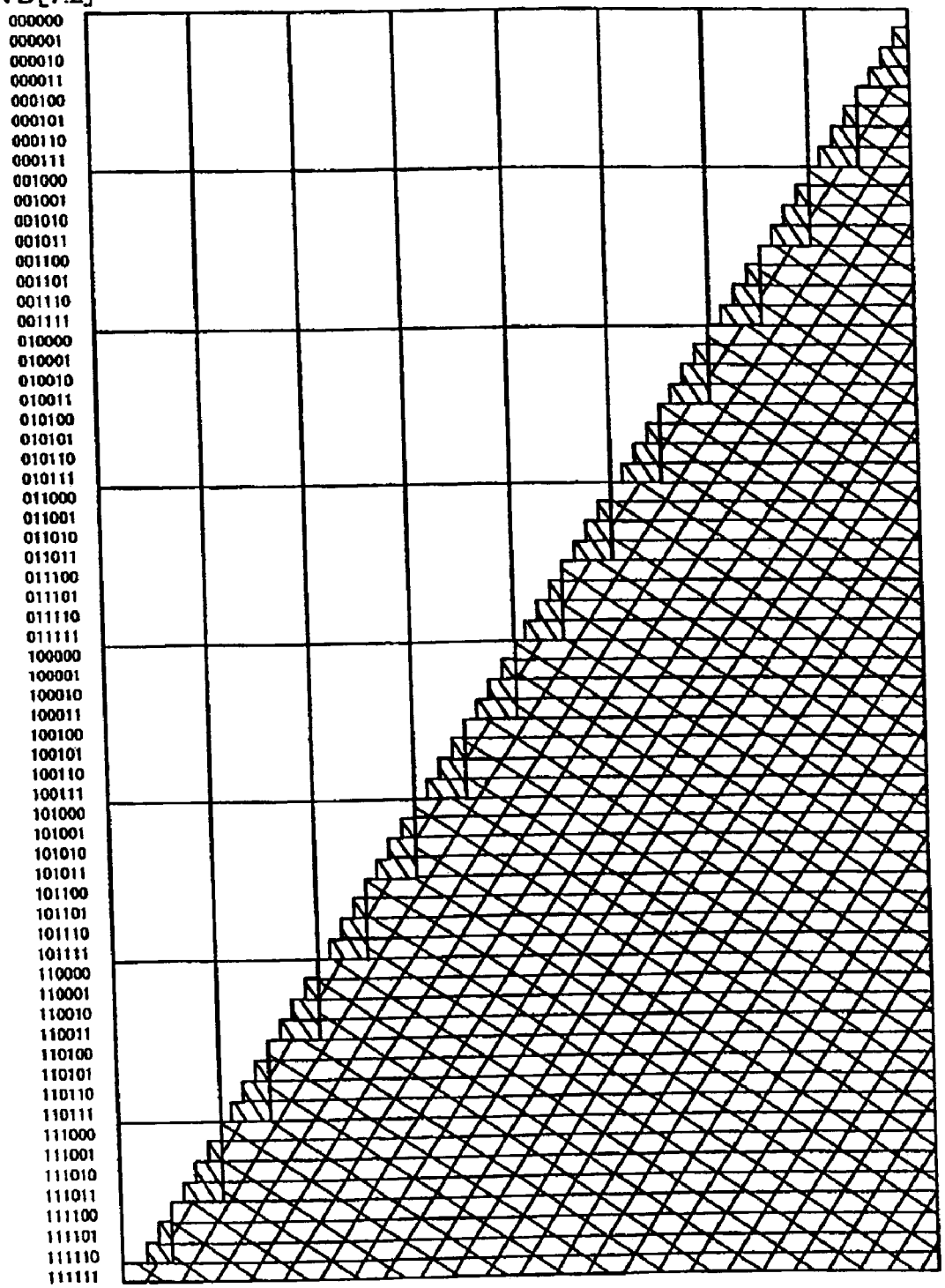
FIG. 4 is diagrammatic view showing the relation between VD and a high-resolution serial data pulse.
Figure 5:
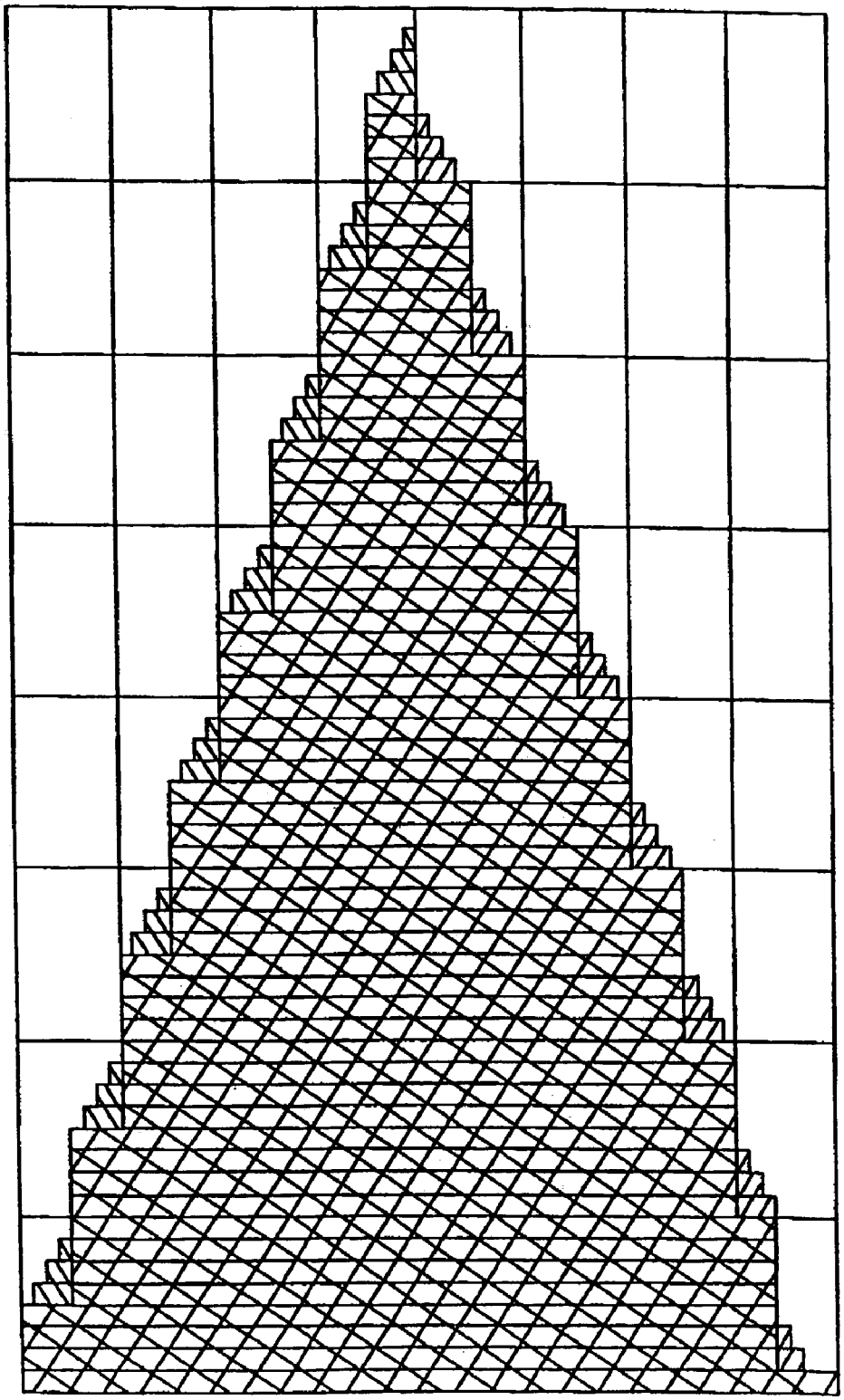
FIG. 5 is diagrammatic view showing the relation between VD and a high-resolution serial data pulse.

FIGS. 3 to 5 show a part of the image data VD specifying the tone of a dot and a generated high-resolution serial data pulse signal corresponding to the part of the image data VD. In FIGS. 3 to 5, VD[7:2] indicates data on the third to the eighth digit from the right of the image data VD, and one dot (eight periods of the clock signal HSCLK) is measured on the horizontal axis. The length of a pulse with respect to a transverse direction represents the pulse width of a high-resolution serial data pulse signal and corresponds to the width of a laser beam with respect to a scanning direction for each dot. In this embodiment, the high-resolution serial data pulse signal is of a negative logic and hence hatched parts in FIGS. 3 to 5 correspond to parts of the low level in a pulse stream. An image of a high image quality can be printed by combining the adjacent dots by using a dot matrix image data. For example, in VD[7:2]=000001 in FIG. 3, a laser beam width of ⅟₆₄ is specified for one dot. However, in some cases, the laser beam is not emitted even if such a narrow laser beam width is specified for a single dot. If a laser beam width is specified by VD[7:2]=111111 for a dot adjacent to the dot, the laser beam can be emitted for those two dots and hence the image can be printed in a high image quality.

In FIGS. 3 to 5, high-resolution serial data pulses are indicated by crisscrossed, oblique lines and parallel, oblique lines. The crisscrossed, oblique lines indicate pulses generated by the fundamental waveform generating circuit 51. The parallel, oblique lines indicate additional delayed pulses generated by the delayed waveform generating circuit 52. The tone is determined principally by the pulses generated by the fundamental waveform generating circuit 51, and the delayed pulses are used for modifying the tone in a higher resolution. Principally VD[7:4] specifies the pulse generated by the fundamental waveform generating circuit 51, VD[4:2] specifies the delayed pulse provided by the delayed waveform generating circuit 52, and VD[7:5] specifies the time for adding the delayed pulse, i.e., the time represented by one of the successive delayed pulses for adding the delayed pulse to the output pulse provided by the fundamental waveform generating circuit 51.

The image processing module 41 provides the parallel data PWMDOT, CUTDOT, ADDDOT, PWMSEL, CUTSEL, ADDSEL and WAVESEL by a predetermined circuit on the basis of VD[7:2]. The parallel data PWMDOT, CUTDOT and ADDDOT are generated according to VD[7:4], and the parallel data PWMSEL, CUTSEL, ADDSEL and WAVESEL are generated according to VD[7:2]. For example, when VD[7:4]=0001 in the data shown in FIG. 3, the parallel data PWMDOT, CUTDOT and ADDDOT are generated so that the fundamental waveform generating circuit 41 generates a serial data pulse signal that rises at the first leading edge of the clock signal HSCLK and falls at the first trailing edge of the clock signal HSCLK in every eights periods of the clock signal HSCLK. When VD[7:2]=000101 in the data shown in FIG. 3, the parallel data PWMSEL, CUTSEL, ADDSEL and WAVESEL are generated so that the HSCLK5 in a time period between the first leading edge and the second leading edge in the eight periods of the clock signal HSCLK is added.

FIGS. 3 to 5 show the stepwise increasing mode of high-resolution data pulses for one dot from the left with tone shown in VD[7:2], the stepwise increasing mode of the same from the right, and the stepwise increasing mode of the same from the middle, respectively. Various data structures of the high-resolution serial data pulses are applicable. One of the stepwise increasing modes shown in FIGS. 3 to 5 maybe specified by a bit other than VD[7:2], and all or one of the data structures may be usable.

(3) Fundamental Waveform Generating Circuit

Figure 6:
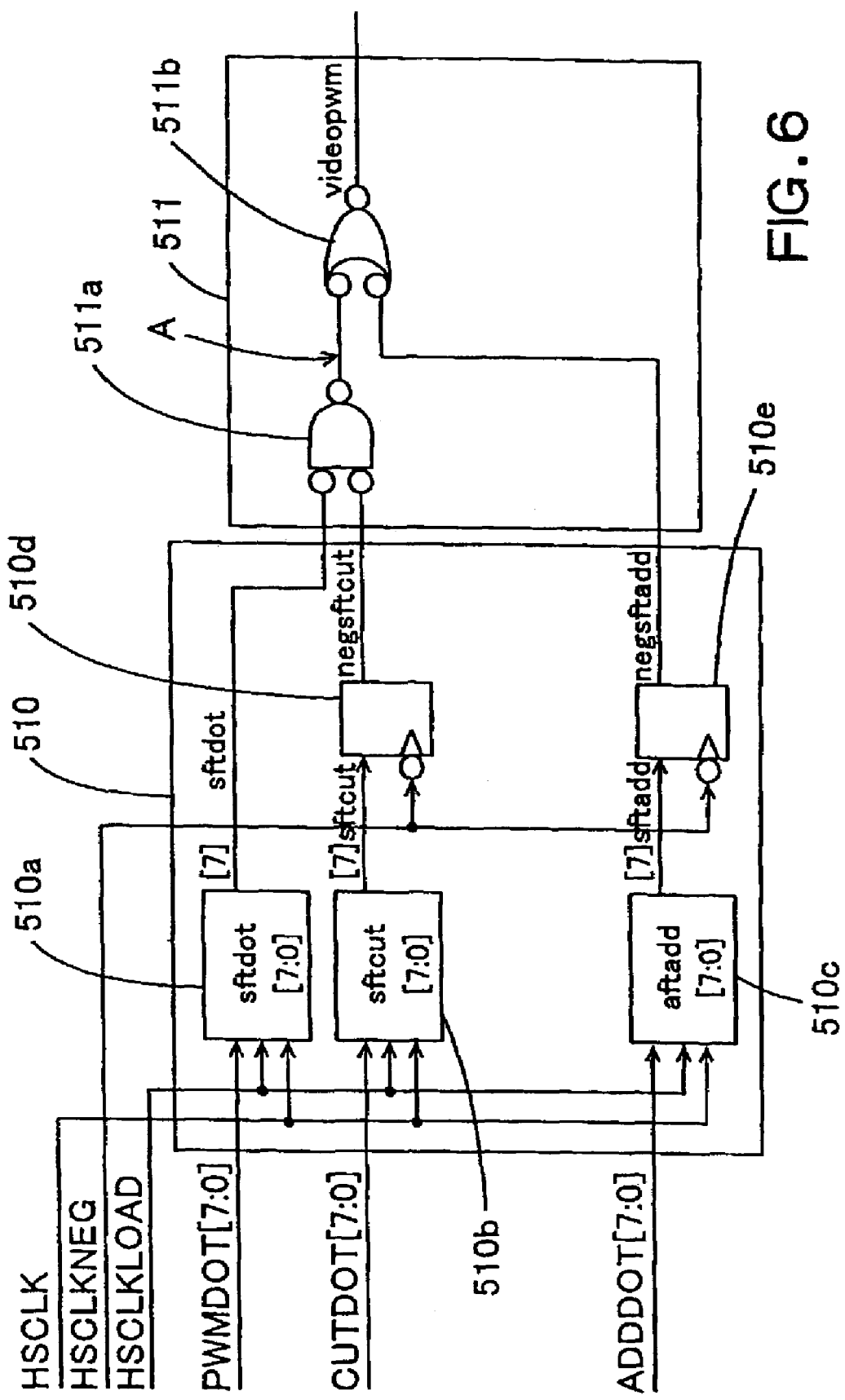
FIG. 6 is a circuit diagram of a fundamental waveform generating circuit.

The configuration of the fundamental waveform generating circuit 51 will be described. FIG. 6 is a circuit diagram showing the shift register unit 510 and the pulse width adjusting unit 511 included in the fundamental waveform generating circuit 51. The shift register unit 510 is provided with shift registers 510a, 510b and 510c, and flip-flops 510d and 510e. Given to the shift registers 510a to 510c are 8-bit parallel data. The parallel data are loaded to the shift registers 510a to 510c by a signal HSCLKLOAD. The shift registers 510a to 510c are triggered by the leading edges of the clock signal HSCLK to convert the parallel data into serial data.

In FIG. 6, the leading edge of the clock signal HSCLK is denoted by HSCLK and the trailing edge of the same is denoted by HSCLKNEG to discriminate the leading edge and the trailing edge from each other. Since the shift registers 510a to 510c are triggered by the leading edge, HSCLK is applied to the shift registers 510a to 510c in FIG. 6. A signal PWMDOT provided by the image processing module 41 is given to the shift register 510a. Loading of PWMDOT to the shift register 510a is indicated by sftdot.

In each data, [7:0] indicates 8-bit data from the first digit (0) to the eighth digit (7) of the parallel data. Although the configurations of the shift registers 510b and 510c are similar to that of the shift register 510a, input data given to the shift register 510b and 510c is different from that given to the shift register 510a. Data CUTDOT and ADDDOT provided by the image processing module 41 ARE GIVEN TO THE SHIFT REGISTERS 510b and 510c, respectively. Narks [7] placed on output lines connected to the shift registers 510a to 510c indicate that the serial data is 8-bit ([0] to [7]).

The flip-flops 510d and 510e are triggered by the trailing edge. As shown in FIG. 6, the trailing edge HSCLKNEG is applied to the flip-flops 510d and 510e. Since the flip-flops 510d and 510e are driven by the trailing edge, bit strings provided by the shift registers 510b and 510c are latched temporarily and are sent out at the trailing edge. Thus, those outputs are serial data having levels varying in a unit shifted by half the period of the clock signal HSCLK relative to the output of the shift register 510a.

The shift register 510a corresponds to the first parallel-to-serial conversion unit, and the combinations of the shift register 510b and the flip-flop 510d, and the shift register 510c and the flip-flop 510e correspond to the second parallel-to-serial conversion unit. The data PWMDOT corresponds to the first parallel data, and the data CUTDOT and ADDDOT correspond to the second parallel data. Output data provided by the shift registers 510a to 510c are denoted by sftdot, sftcut and sftadd, and bits are discriminated from each other by a mark [ ]. Output data provided by the flip-flops 510d and 510e are denoted by negsftcut and negsftadd.

The pulse width adjusting unit 511 includes a NAND device 511a to which inverted data of the data sftdot and negsftcut is given, and a NOR device 51b to which NAND output and inverted data of negsftadd are applied. This logic circuit adjusts the width of sftdot between the edges of sftdot and negsftcut or adjusts the width of sftdot between the edges of sftdot and negsftadd, and provides a signal videopwm. The signal videopwm is a pulse obtained by adding a pulse of a width corresponding to half the period of the clock signal HSCLK to or subtracting the same from sftdot. The signal videopwm is serial data pulses forming the part hatched with crisscrossed oblique lines in FIGS. 3 to 5.

Figure 7:
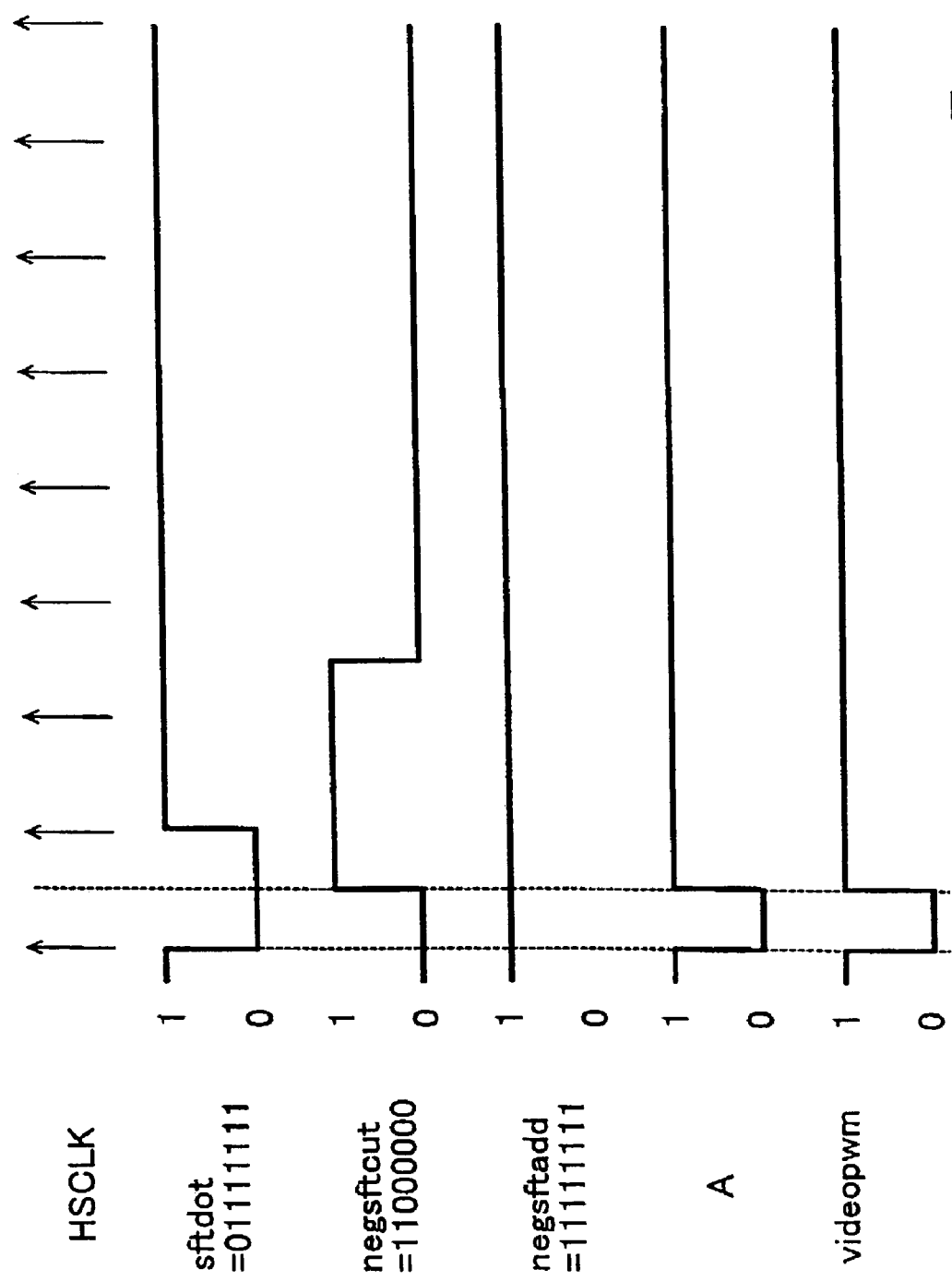
FIG. 7 is a time chart of assistance in explaining signal processing operations of a pulse width adjusting unit.
Figure 8:
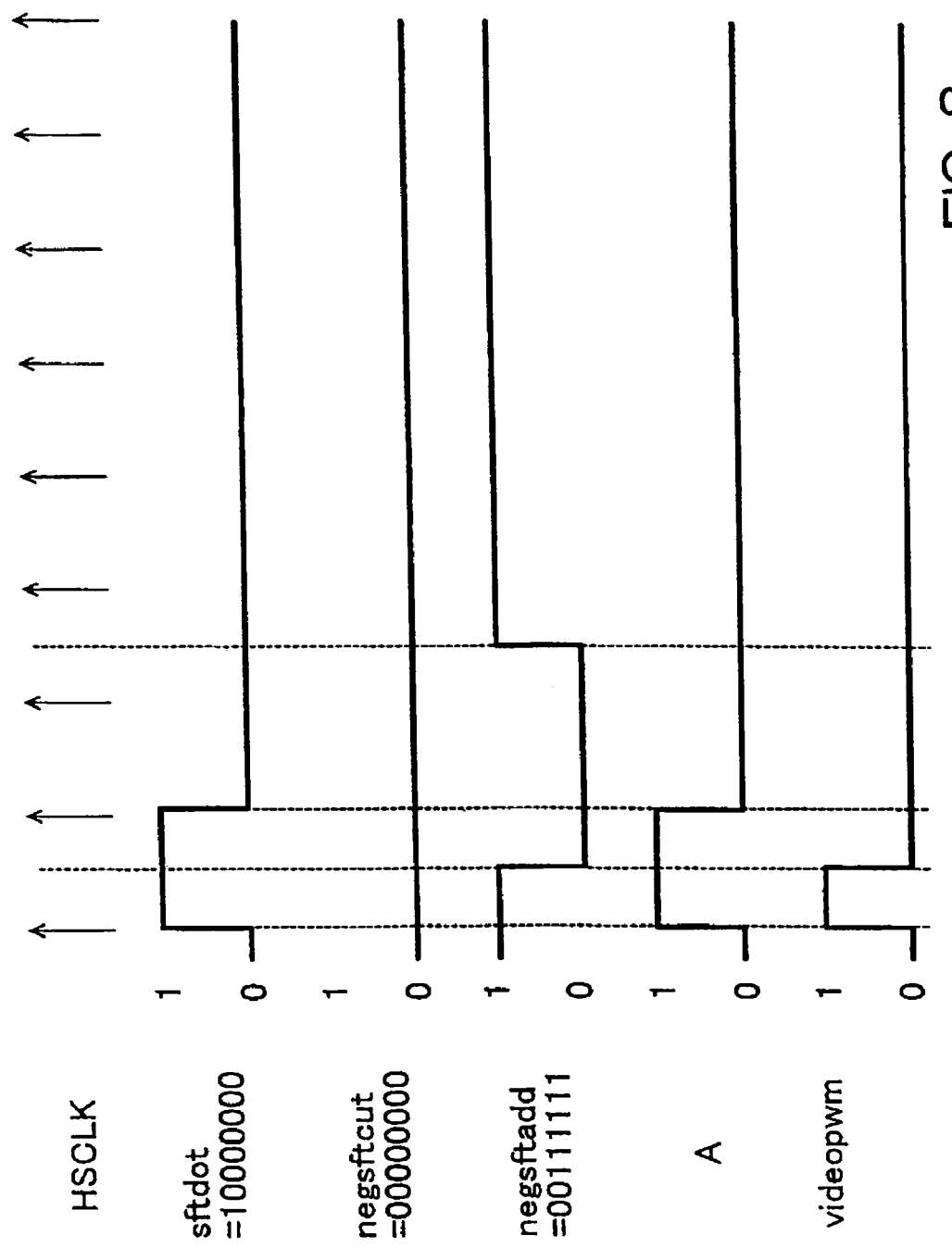
FIG. 8 is a time chart of assistance in explaining signal processing operations of a pulse width adjusting unit.

FIGS. 7 and 8 are time charts of assistance in explaining signal processing operations of the pulse width adjusting unit 511. In each of FIGS. 7 and 8, leading edges of the clock signal HSCLK are shown on the top row. FIG. 7 shows signals for a case where sftdot=01111111, negsftcut=11000000 and negsftadd=11111111. Since the signal sftdot is a pulse signal that changes its level at the leading edges of the clock signal HSCLK, the level of the left end is "0" corresponding to the eighth digit (sftdot[7])=0, and the level of the rest is "1". Since negsftcut is a pulse signal that changes its level at the trailing edges of the clock signal HSCLK, each of the edges of a pulse corresponds to the middle point between the successive leading edges of the clock signal HSCLK, the level of the left end is "0" corresponding the seventh and the eighth digit (sftdot[7], [6])="1", and the level of the rest is "0". The level of negsftadd is "1" for all the bits.

When sftdot and negsftcut are given to the NAND device 511a, the NAND device 511a provides an output pulse signal A having edges corresponding to a leading edge and a trailing edge adjacent to the leading edge of the clock signal HSCLK, and a left end pulse of "0" as shown in FIG. 7. The output pulse signal A and negsftadd are given to the NOR device 511b. Then, the NOR device 511b provides videopwm having edges corresponding to a leading edge and a trailing edge adjacent to the leading edge of the clock signal HSCLK, and a left end pulse of "0" as shown in FIG. 7. As mentioned above, videopwm is of a negative logic. Thus, the width of the pulse of level "0" of sftdot is cut partly by the foregoing processes.

FIG. 8 shows signals for a case where sftdot=10000000, negsftcut=00000000 and negsftadd=00111111. The signal sftdot the level of the left end is "1" corresponding to the eighth digit (sftdot[7])=1, and the level of the rest is "0". The level of negsftcut is "0" for all the bits. Each of the edges of negsftadd corresponds to the middle point between the successive leading edges of the clock signal HSCLK, the level of the left end is "0" corresponding the seventh and the eighth digit (sftdot[7], [6])="0", and the level of the rest is "1". When sftdot and negsftcut are given to the NAND device 511a, the NAND device 511a provides an output pulse signal A identical with sftdot. The output pulse signal A and negsftadd are given to the NOR device 511b. Then, the NOR device 511b provides videopwm having edges corresponding to a leading edge and a trailing edge adjacent to the leading edge of the clock signal HSCLK, and a left end pulse of "1" as shown in FIG. 8. As mentioned above, videopwm is of a negative logic. Thus, the width of the pulse of level "0" of sftdot is increased partly by the foregoing processes.

The pulse width adjusting unit 511 is capable of cutting the pulse width of sftdot by the negsftcut and of increasing the pulse width of sftdot by negsftadd. Thus, desired videopwm in which the pulse width changes every half the period of the clock signal HSCLK can be generated by adjusting the values of PWMDOT, CUTDOT and ADDDOT by the image processing module 41. FIGS. 9 to 11 show typically videopwm provided corresponding to VD [7:2], which corresponds to VD [7:4] excluding some exceptions. Structures of data shown in FIGS. 9 to 11 correspond to those shown in FIGS. 3 to 5, respectively.

When the data structure shown in FIG. 3 is employed, videopwm shown in FIG. 9 is generated by VD [7:2]. In FIG. 9, pulse width is measured on the horizontal axis, the width of meshes corresponds to half the period of the cock signal HSCLK, and vertical lines defining the meshes correspond to times when the leading edges and the trailing edges appear. In FIGS. 9 to 11, meshes with "−" indicate parts cut by negsftcut, and meshes with "+" indicate parts added by negsftadd. As obvious from FIGS. 9 to 11, videopwm having a pulse width adjusted in a unit corresponding to half the period of the clock signal HSCLK can be obtained for pulses of any pulse width by adding the pulse width corresponding to half the period of the clock signal HSCLK to or cutting the same from sftdot having opposite edges corresponding to the leading edges. The pulse width adjusting unit 511 corresponds to the pulse width adjusting unit and the serial data output unit.

Although this embodiment is satisfactory when the pulse width of sftdot in a unit corresponding to half the period of the clock signal HSCLK by negsftcut and negsftadd, negsftcut and negsftadd have sufficiently big pulse widths so that the edges of sftdot do not coincide with those of negsftcut and negsftadd to avoid glitches. FIG. 12 is a time chart of assistance in explaining causes of glitches. In softdotA, negsftcutA and videopwmA shown in an upper part of FIG. 12, in a state where the leading edge of sftdotA coincides with the trailing edge of negsftcutA, a glitch Ga occurs in videopwmA obtained by combining negsftcutA and sftdotA if the trailing edge of negsftcutA appears before the leading edge of the sftdotA as shown in FIG. 12.

Similarly, in sftdotB, negsftaddB and videopwmB shown in a lower part of FIG. 12, in a state where the trailing edge of sftdotB coincides substantially with the leading edge of negsftaddB, a glitch Gb occurs in videopwmB obtained by combining negsftaddB and sftdotB if the leading edge of negsftaddB appears before the trailing edge of sftdotB as shown in FIG. 12. In this embodiment, negsftcut and negsftadd have sufficiently big pulse widths to prevent the occurrence of glitches, and the image processing module 41 generates CUTDOT and ADDDOT having necessary and sufficient pulse widths.

(4) Delayed Waveform Generating Circuit

Figure 13:
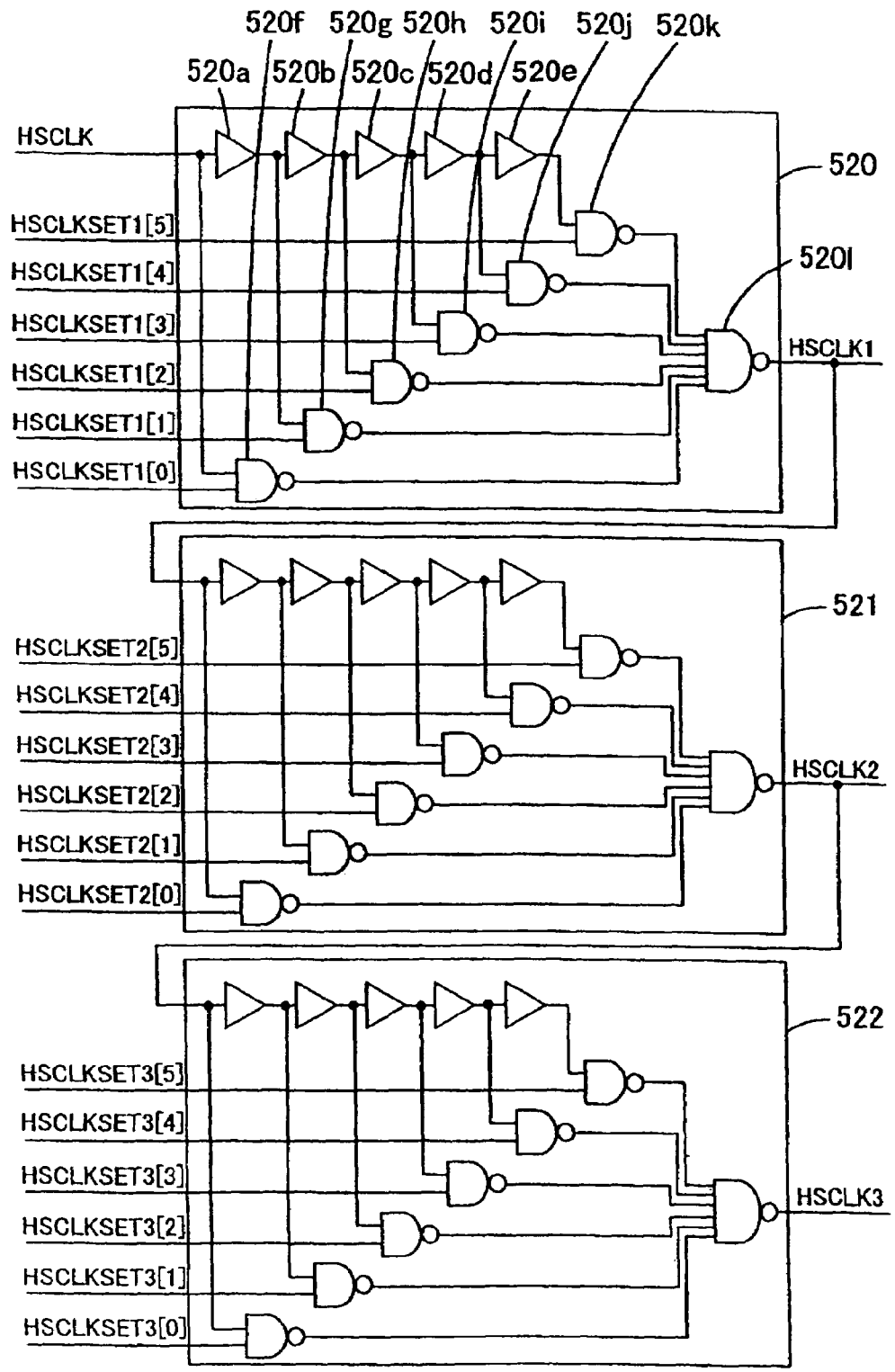
FIG. 13 is a circuit diagram of essential parts of a delayed waveform generating circuit.

The essential part of the delayed waveform generating circuit 52 will be described. FIG. 13 shows the respective configurations of the first delay circuit 520, the second delay circuit 521 and the third delay circuit 522 of the delayed waveform generating circuit 52. The delay circuits 520 to 522 are the same in configuration as mentioned above. Different input signals are given to the delay circuits 520 to 522, respectively, and the delay circuits 520 to 522 provide different output signals, respectively. The first delay circuit 520 includes five buffers 520a to 520e, six NAND devices 520f to 520k, and a NAND device 5201. The clock signal HSCLK is given to the first delay circuit 520. The clock signal HSCLK and the respective outputs of the buffers 520a to 520e are given to the NAND devices 520f to 520k, respectively.

The HSCLKSET1 provided by the register 54 is given to the other inputs of the NAND devices 520f to 520k. The HSCLKSET1 is 6-bit parallel data. The bits HSCLKSET1 [0] to HSCLKSET1 [5] are given to the NAND devices 520f to 520k, respectively. Only signals corresponding to the bit "1" among the HSCLKSET1 pass the NAND devices 520f to 520k and the NAND device 5201. Thus, the NAND devices 520f to 520k and the NAND device 5201 correspond to the delayed pulse gate.

Pulses that pass the NAND device 5201 are delayed by predetermined delay times while the same pass the buffers 520a to 520e and the NAND devices 520f to 5201. Thus, those devices correspond to the clock signal delaying unit. Signals that pass the NAND devices 520f to 520k differ from each other in the number of the buffers through which the signals passed before arriving at the NAND devices 520f to

520k. Therefore, the pulses provided by the NAND devices 520f to 520k are delayed by different delay times, respectively. A desired delay time can selectively be provided by setting a desired bit to "1" in the HSCLKSET1. The first delay circuit 520 provides delayed pulse HSCLK1.

The delayed pulse HSCLK1 is given to the second delay circuit 521 as a predetermined clock signal, and the delayed pulse HSCLK2 is given to the third delay circuit 522 as a predetermined clock signal. The delayed pulse HSCLK2 is delayed with respect to the delayed pulse HSCLK1, and the delayed pulse HSCLK3 is delayed with respect to the delayed pulse HSCLK2. The respective component devices of the first delay circuit 520, the second delay circuit 521 and the third delay circuit 522 are substantially similar ones and hence the delay times by which the delay circuits 520 to 522 delay the pulses are substantially equal to each other. In this embodiment, those delay times are ¼ of half the period of the clock signal HSCLK. Fine adjustment of the delay times is achieved by HSCLK1 to HSCLK3 given to the delay circuits 520 to 522.

Figure 14:
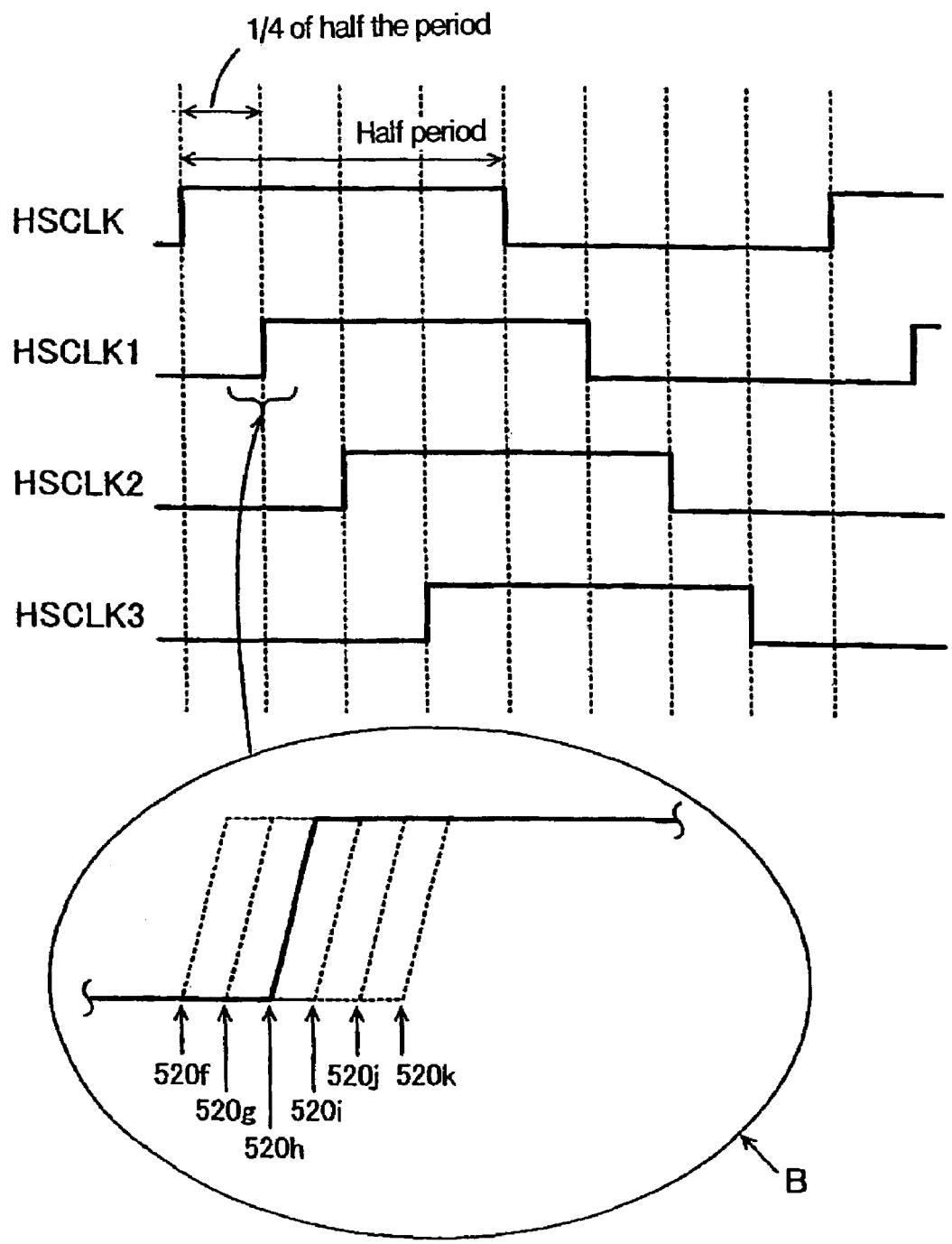
FIG. 14 is a diagram showing delayed pulse signals HSCLK1 to HSCLK3.

FIG. 14 is a time chart showing the clock signal HSCLK and the delayed pulses HSCLK1 to HSCLK3 generated by the delayed waveform generating circuit 52. As shown in FIG. 14, half the period of the clock signal HSCLK corresponds to a time period in which the level of the clock signal HSCLK remains substantially constant. When the HSCLK1 delayed by a delay time corresponding to ¼ of half the period of the clock signal HSCLK is generated by the first delay circuit 520, the second delay circuit 521 delays HSCLK1 by a delay time corresponding to ¼ of half the period of the clock signal HSCLK to generate HSCLK2. Consequently, HSCLK2 is delayed by half the period of the clock signal HSCLK with respect to the clock signal HSCLK. The third delay circuit 522 provides HSCLK3 delayed by ¾ of half the period of the clock signal HSCLK with respect to the clock signal HSCLK.

The leading edge of HSCLK1 is shown in an enlarged view enclosed by an oval line in FIG. 14. Continuous line in the enlarged view indicates a delayed pulse provided by the NAND device 520h, and broken lines indicate the leading edges of delayed pulses provided by the NAND devices 520f, 520g, 520i, 520j and 520k. Since the delay times of the pulses provided by the NAND devices 520f and 520g are shorter than that of the pulse provided by the NAND device 520h, the leading edges of the pulses provided by the NAND devices 520f and 520g appear before the leading edge indicated by continuous line of the pulse provided by NAND device 520h. Since the delay times of the pulses provided by the NAND devices 520i to 520k are longer than that of the pulse provided by the NAND device 520h, the leading edges of the pulses provided by the NAND devices 520i to 520k appear after the leading edge indicated by continuous line of the pulse provided by NAND device 520h.

Since the respective leading edges of the delayed pulses provided by the NAND devices 520f to 520k appear at different times, respectively, the manufacturer of the laser printer 10 is able to select a leading edge at the most proper time for fine adjustment. The selection of the delayed pulse can very easily be achieved by properly changing the parallel data stored in the register 54.

Figure 15:
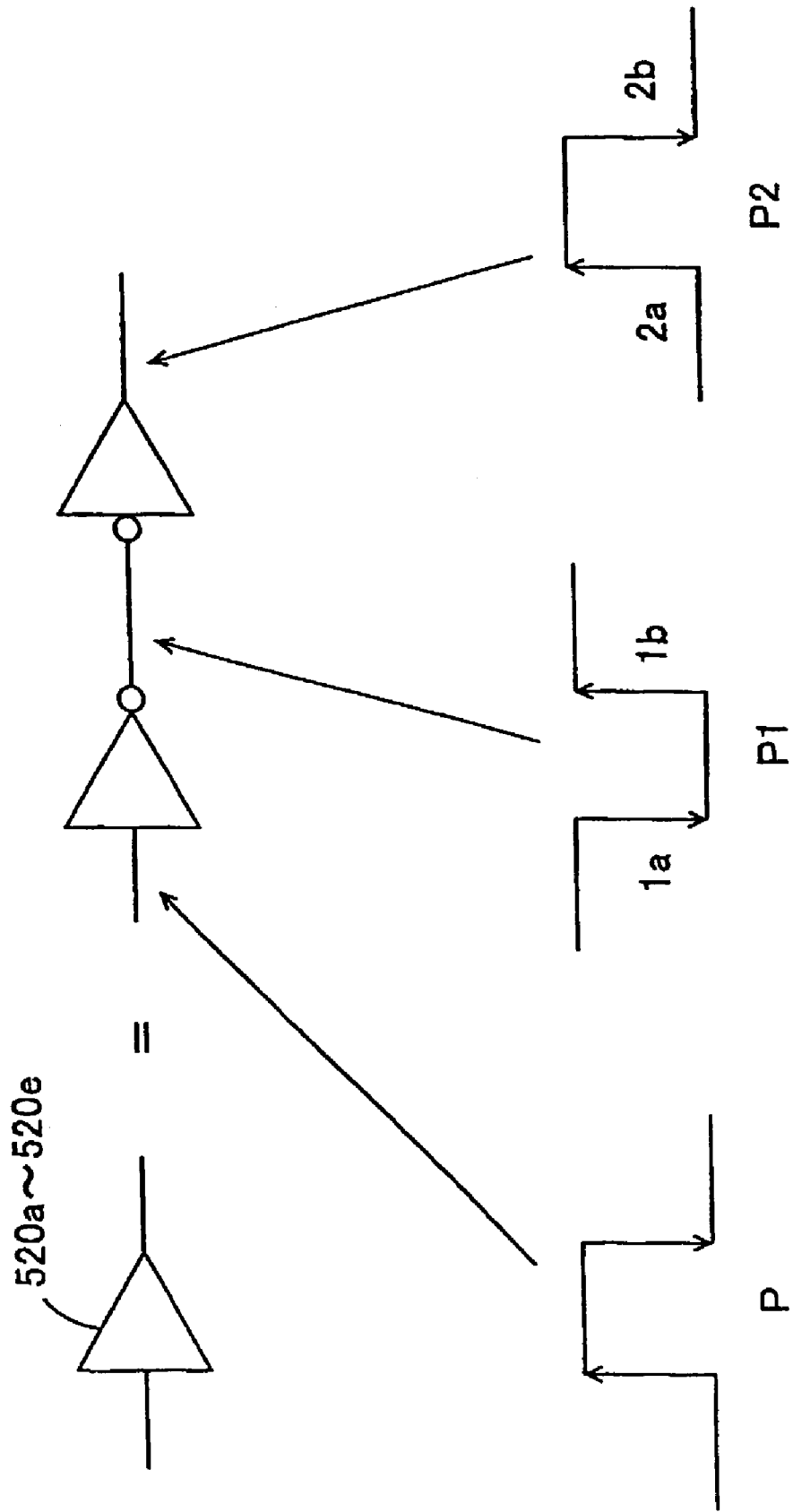
FIG. 15 is a diagrammatic view of assistance in explaining buffers 520a to 520e.

FIG. 15 is a view of assistance in explaining the configurations of the buffers 520a to 520e. Each of the buffers 520a to 520e consists of two NOT devices. The front NOT device inverts a pulse P and provides a pulse P1, and the back NOT device inverts the pulse P1 to provide a pulse P2. The leading edge of the pulse P is converted into a trailing edge 1a by the first inversion, and the trailing edge 1a is converted into a leading edge 2a by the second inversion. The trailing edge of the pulse P is converted into a leading edge 1b by the first inversion, and the leading edge 1b is converted into a trailing edge 2b by the second inversion.

Thus, the leading and the trailing edge of the pulse P are inverted by the same number of times. Generally, when a signal is inverted by a NOT device, a delay time by which the signal is delayed by converting a leading edge into a trailing edge, and a delay time by which the signal is delayed by converting a trailing edge into a leading edge are different from each other. Therefore, if a signal is delayed by a simple buffer not including a plurality of NOT devices or not performing inversion a plurality of times, the leading and the trailing edge of a pulse are delayed by different delay times, respectively and, consequently, the pulse width is changed. When a signal is delayed by using an even number of NOT devices, the leading and trailing edge of a pulse are inverted by the same number of times. Consequently, change of the pulse width can be prevented and the deformation of the shape of the pulse by delaying can be prevented. In this embodiment, each of the buffers 520a to 520e is formed of two NOT devices to maintain the waveforms of HSCLK1 to HSCLK3 substantially unchanged.

(5) High-resolution Serial Data Generating Circuit

Figure 16:
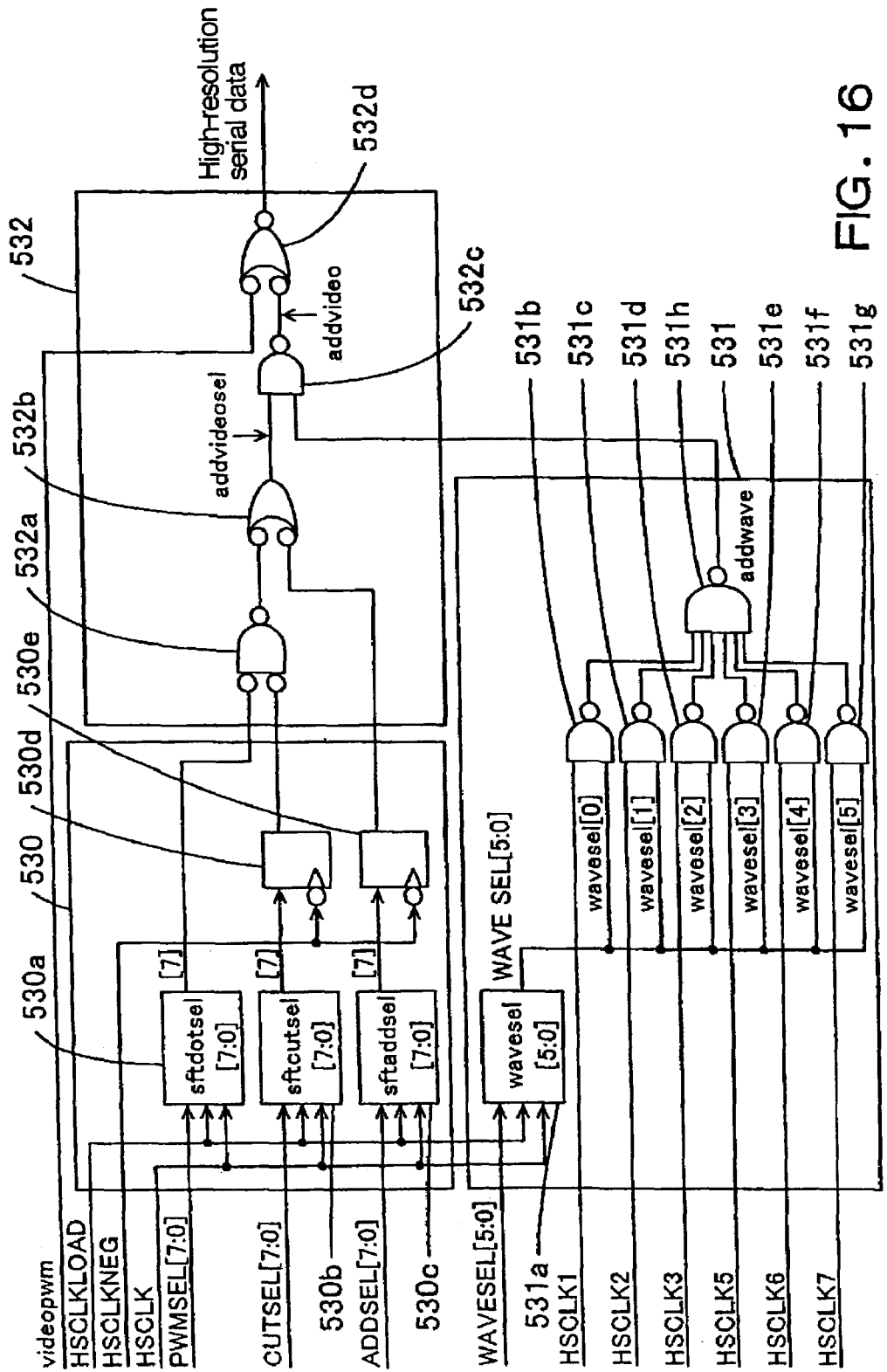
FIG. 16 is a circuit diagram of a high-resolution serial data generating circuit.

The configuration of the high-resolution serial data generating circuit 53 will be described. FIG. 16 is a circuit diagram of the shift register unit 530, the selector unit 531 and the pulse width adjusting unit 532 of the high-resolution serial data generating circuit 53. The shift register unit 530 is a circuit similar to the shift register unit 510 of the fundamental waveform generating circuit 51. The shift register unit 530 includes shift registers 530a, 530b and 530c to which parallel data is loaded at the leading edge of the clock signal HSCLK, and flip-flops 530d and 530e to be triggered by the trailing edge of the clock signal HSCLK.

Input signals PWMSEL, CUTSEL and ADDSEL, which are different from the input signals given to the shift register unit 510, are given to the shift registers 530a to 530c, respectively. Thus, the shift register unit 530 is able to generate serial data of a pattern different from that of pulses generated by the shift register unit 510. The pulse width adjusting unit 532 is provided with devices 532a and 532b substantially the same as the devices 511a and 511b of the pulse width adjusting unit 511. The output of the device 532b is inverted, which is different from the pulse width adjusting unit 511. Timing serial data pulses addvideosel having a pulse width that changes in a unit corresponding to half the period of the clock signal HSCLK can be generated by the shift register unit 530 and the devices 532a and 532b.

The selector unit 531 includes a register 531a, NAND devices 531b, 531c, 531d, 531e, 531f and 531g, and a NAND device 531h. The register 531a is triggered by the leading edge of the clock signal HSCLK. WAVESEL[5:0] provided by the image processing module 41 is loaded to the register 531a. Bits provided by the register 531a are input signals to the NAND devices 531b to 531g. Although the outputs of the register 531 are indicated by a single line in FIG. 16, the register 531a provides parallel data, and individual data WAVESEL[0] to WAVESEL[5] for the bits are given to the NAND devices 531b to 531g, respectively.

The HSCLK1 to HSCLK3 and HSCLK5 to HSCLK7 are applied to the other inputs of the NAND devices 531b to 531g, respectively. A desired one of the signals HSCLK1 to HSCLK3 and HSCLK5 to HSCLK7 can be selected by setting one of WAVESEL[5:0] to "1" (HIGH). The NAND 531h provides the selected signal addwave. Pulse width adjustment for the parts hatched with parallel, oblique lines in FIGS. 3 to 5 is dependent on the selection of HSCLK1 to HSCLK3 and HSCLK5 to HSCLK7. Therefore, the WAVESEL is determined such that the image processing module 41 selects a proper delayed pulse from HSCLK1 to HSCLK3 and HSCLK5 to HSCLK7 according to the contents of VD in the data structures shown in FIGS. 3 to 5.

FIG. 17 is a table showing VD and the corresponding WAVESEL in the data structures shown in FIGS. 3 to 5. In the data structures shown in FIG. 3 and 4, WAVESEL is dependent on VD[4:2]. In the data structures shown in FIG. 5, WAVESEL is dependent on VD[5:2]. For example, in FIG. 3, both VD[7:2]= 000001 and VD[7:2]=001001 indicate data pulses obtained by adding a pulse of a pulse width equal to ¼ of half the period of the clock signal HSCLK to a pulse in a unit of the period of the clock signal HSCLK, and are generated by using the edge of HSCLK3. In FIG. 3, the shape of a right end part of the high-resolution serial data pulse changes periodically with the increase of the value of VD. Therefore, the selection of one of HSCLK1 to HSCLK3 and HSCLK5 to HSCLK7 can be achieved by VD[4:2].

In the data structure shown in FIG. 4, selection can be achieved by VD[4:2]. Since there are two types of patterns (addition to the right end and addition to the left end) for adding a pulse of a pulse width equal to ¼ of half the period the clock signal HSCLK in the data structure shown in FIG. 5, the selection can be achieved by VD[5:2]. The image processing module 41 provides WAVESEL according to VD[4:2] or VD[5:2] as shown in FIG. 17. In WAVESEL, "0" represents the low level (LOW) and "1" represents the high level (HIGH).

The pulse width adjusting unit 532 combines videopwm provided by the fundamental waveform generating circuit 51 and addwave provided by the NAND device 531h, and provides high-resolution serial data pulse. Since addwave includes successive pulses, it is difficult to generate a pulse of a specified width as shown in FIGS. 3 to 5 by combining the successive pulses and videopwm. This embodiment uses addvideosel for specifying a time range for performing combination.

The signal addwave is given to the NAND device 532c together with addvideosel. The signal addwave is able to pass the NAND device 532c only while the addvideosel is HIGH. A device 532d is able to carry out pulse width adjustment only in a proper time range by combining the signal addvideo passed the NAND device 532c and videopwm, and is able to adjust the pulse width in a part between the edges of the pulses.

FIGS. 18 to 20 show typically addvideosel corresponding to the data structures shown in FIGS. 3 to 5 for the values of the data of VD[7:4]. In FIGS. 18 to 20, parts hatched with crisscrossed, oblique lines indicate pulse widths of addvideosel, and the hatched parts are HIGH. In FIGS. 18 to 20, the width of meshes corresponds to half the period of the clock signal HSCLK. As mentioned above, VD[4:2] is data principally for specifying pulse width in a resolution of ¼ of half the period of the clock signal HSCLK, and the widths of all the pulses are dependent mainly on VD[7:4]. The image processing module 41 determines PWMSEL, CUTSEL and ADDSEL so that the data structures shown in FIGS. 3 to 5 have pulse widths shown in FIGS. 18 to 20 according to the values of VD[7:4], and provides PWMSEL, CUTSEL and ADDSEL.

For example, there are four pulses indicated by VD[7:4]= 0001 in FIG. 3. All those pulses have a pulse width corresponding to one period at the left end of the cock signal HSCLK. In FIG. 18, the pulse width of pulses indicated by VD[7:4]=0001 of addvideosel corresponds to one period at the left end of eights periods of the clock signal HSCLK. Therefore, only HSCLK1 to HSCLK3 and HSCLK5 to HSCLK7 corresponding to those times pass and combined with videopwm at those times. Thus, one of VD[7:4]=0001 can be generated.

The high-resolution serial data generating circuit 53 thus generates timing serial data pulses specifying time regions for pulse width adjustment. The pulse generated by the delayed waveform generating circuit 52 is added to the fundamental waveform generating circuit 51 in those time ranges. Consequently, a high-resolution serial data pulse capable of specifying a tone in a unit of ¹⁄₆₄ of one dot corresponding to eight periods of the clock signal HSCLK can be generated.

(6) Pulse Shaping Operation

A mode of generating the high-resolution serial data pulse will be explained with reference to time charts. First, an operation for generating videopwm by the fundamental waveform generating circuit 51 will be explained. This embodiment specifies the data structure VD[7:2]=0101XX shown in FIG. 4 for dots shown in FIGS. 21 to 23, and specifies the data structure VD[7:2]=1011XX shown in FIG. 3 for the next dots. Thus, any one of the data structures shown in FIGS. 3 to 5 can be used. In those data, XX indicates optionality because the operation of the fundamental waveform generating circuit 51 is not dependent on VD[3:2].

Figure 21:
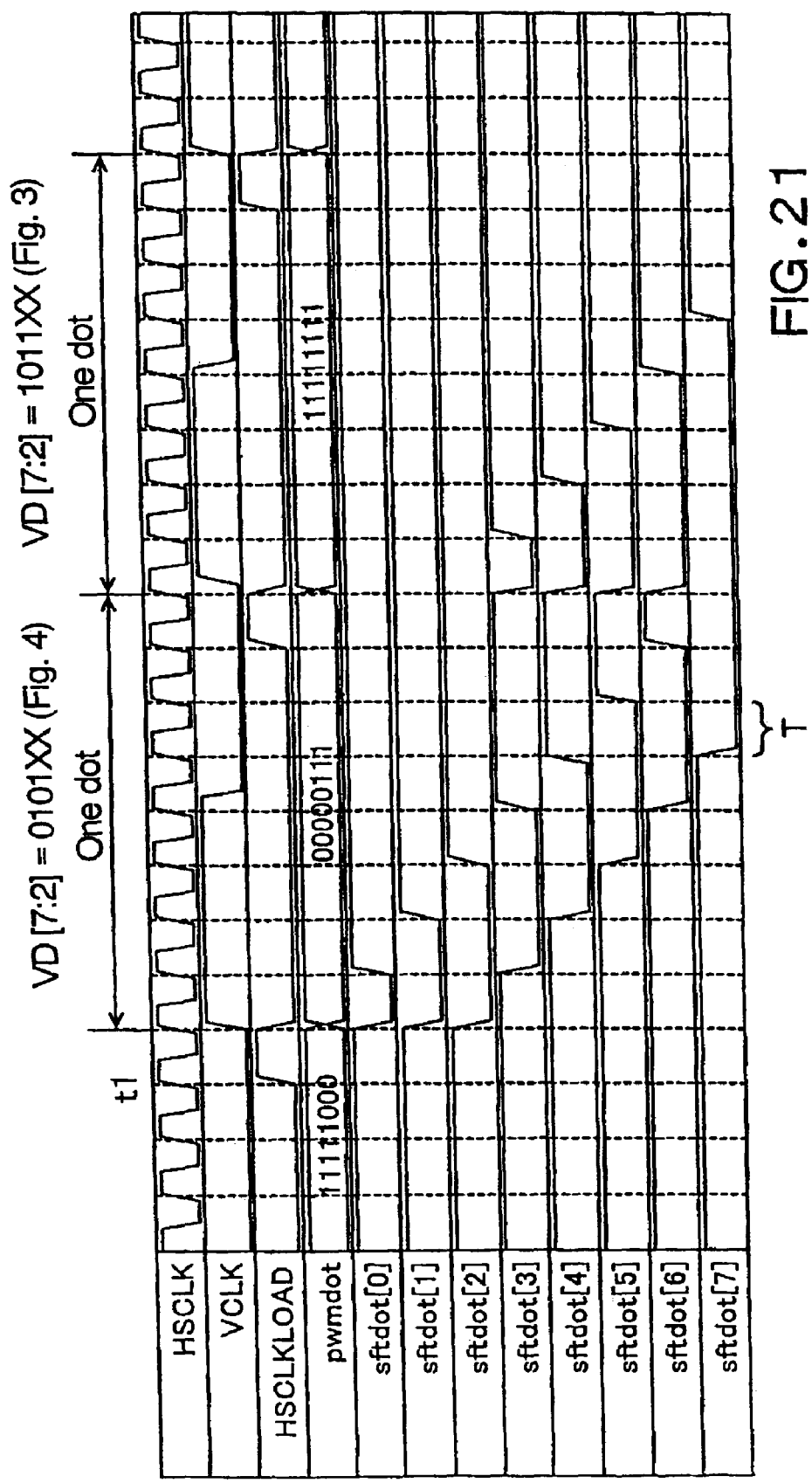
FIG. 21 is a time chart of assistance in explaining data given to and provided by a shift register.
Figure 22:
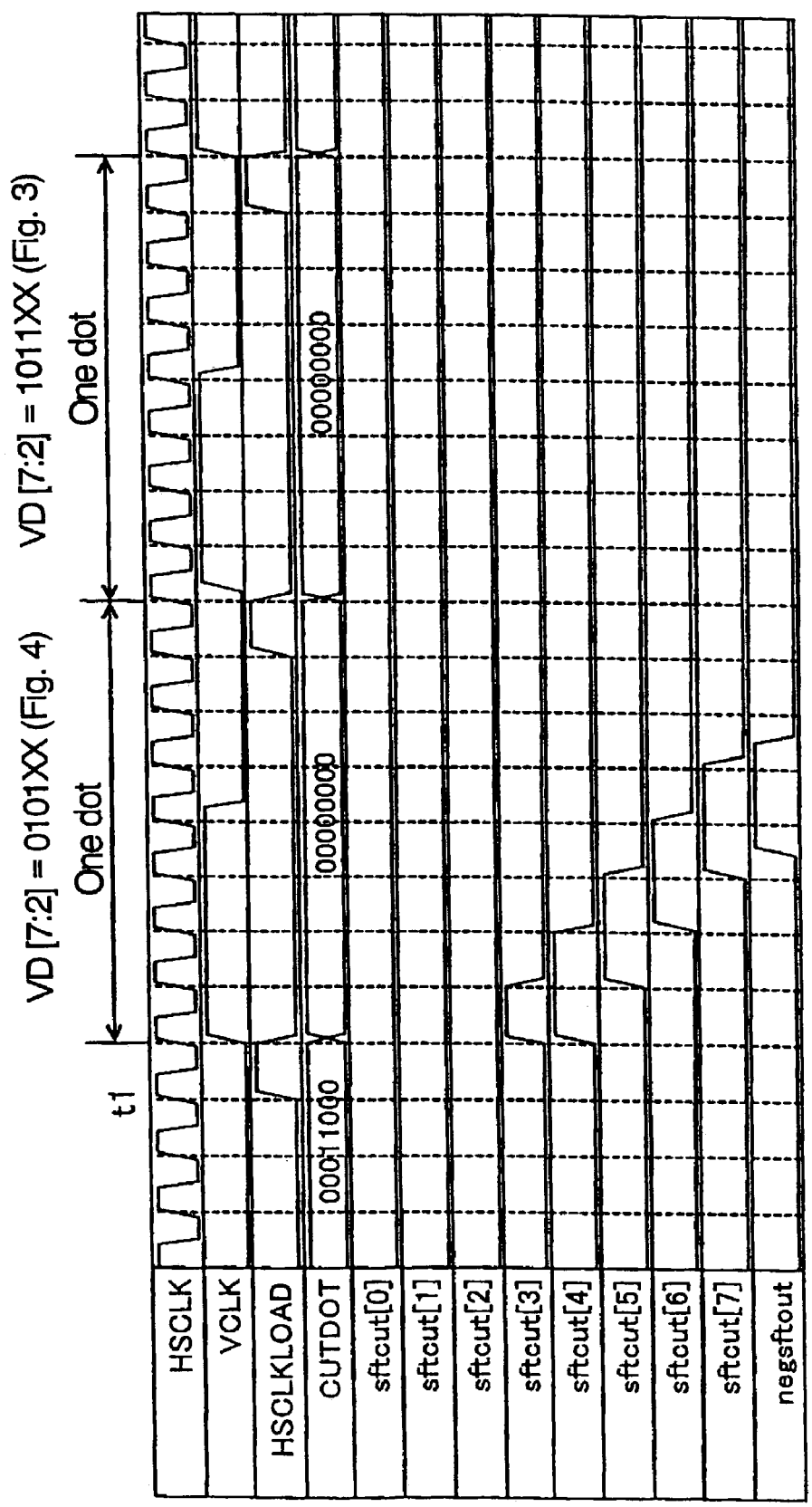
FIG. 22 is a time chart of assistance in explaining data given to and provided by a shift register.
Figure 23:
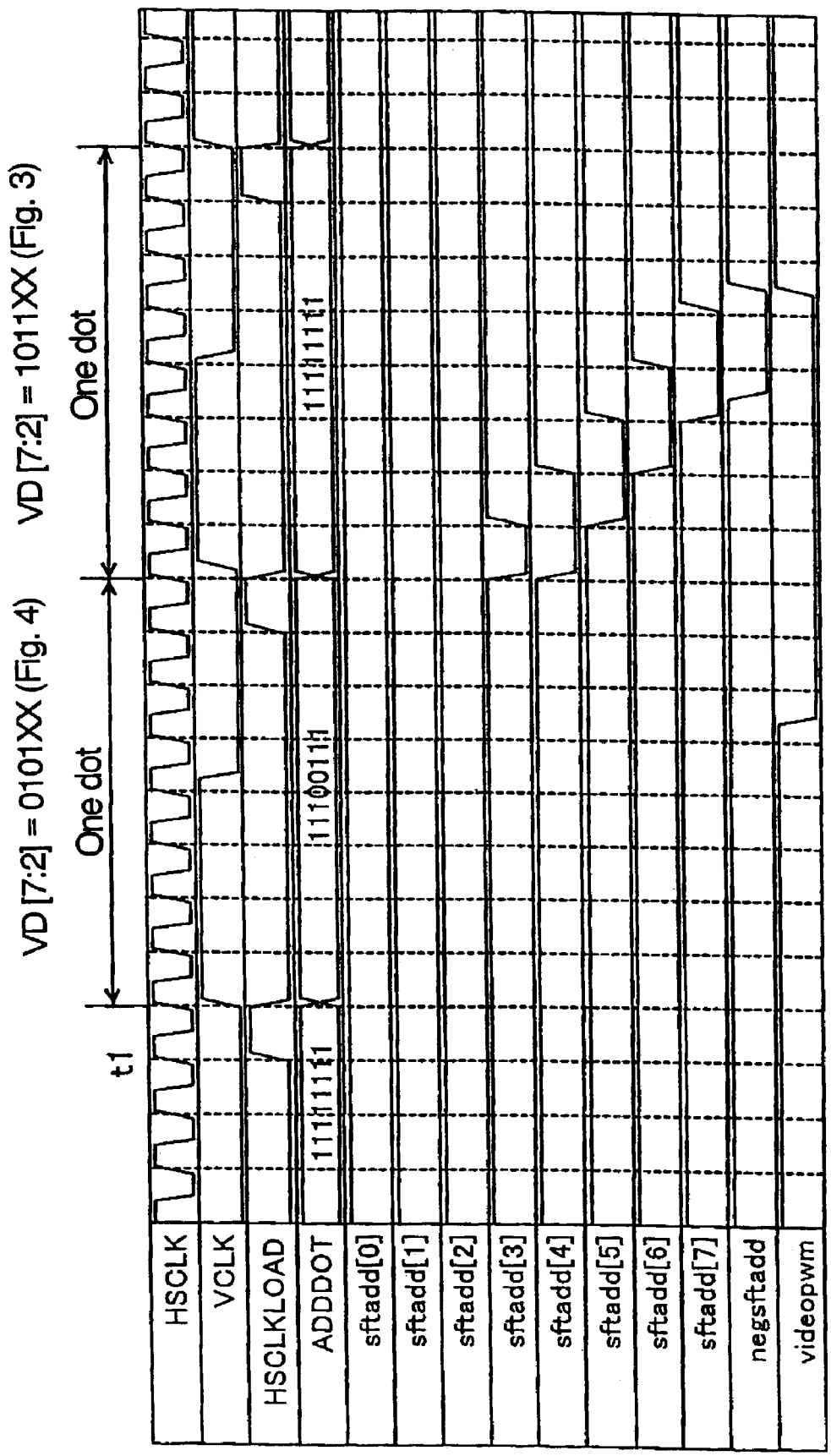
FIG. 23 is a time chart of assistance in explaining data given to and provided by a shift register.

The operation of the fundamental waveform generating circuit 51 will be explained in connection of VD[7:2] =0101XX of the data structure shown in FIG. 4. FIGS. 21, 22 and 23 show input and output data respectively connected with the shift registers 510a, 510b and 510c. The clock signal HSCLK, video clock VCLK and HSCLKLOAD are shown in an upper part of each of diagrams shown in FIGS. 21 to 23. Since one period of the video clock VCLK corresponds to one dot, eight periods of the clock signal HSCLK correspond to one dot. When a process for VD[7:2]=0101XX shown in FIG. 4 is executed, VD[7:2]= 0101XX is given to the image processing module 41, and the image processing module 41 provides PWMDOT[7:0] =11111000.

This parallel data is loaded to the shift register 510a at HSCLKLOAD at time $t_1$. Then, the serial output of the loaded data is started at the leading edge of the clock signal HSCLK. Thus, sftdot[0] to sftdot[7] are provided successively at the leading edges of the clock signal HSCLK. After the output of the data corresponding to eight clock pulses, an initial serial data pulse signal sftdot[7] having a part of LOW corresponding to three preceding clock pulses, and a part of HIGH corresponding to five succeeding clock pulses is generated.

Upon the reception of VD[7:2]=0101XX, the image processing module 41 provides CUTDOT[7:0]=00011000 shown in FIG. 22. This parallel data is loaded to the shift register 510b at HSCLKLOAD at time $t_1$. Then, the serial output of the loaded data starts at time corresponding to the leading edge of the next pulse of the clock signal HSCLK. Eventually, an initial serial data pulse signal sftcut [7] having a part of LOW corresponding to three preceding clock pulses, a part of HIGH corresponding to two succeeding clock pulses, and a part of LOW corresponding to the succeeding three is generated. The flip-flop 510d latches the serial data and provides the same at the trailing edges. Thus, pulse width adjusting serial data pulses delayed by a delay time corresponding to half the period of the clock signal HSCLK with respect to sftcut are generated from negsftcut.

Since the image processing module 41 provides ADDDOT[7:2]=11111111, both sftadd and negsftadd remain LOW in a period corresponding to eight clock pulses after the signal HSCLKLOAD. The signal negsftadd is inverted, and inverted negsftadd is given to the device 511*b*, and hence the output of the pulse width adjusting unit 511 is not directly affected. The signals sftdot shown in FIG. 21 and negsftcut shown in FIG. 22 are given to the device 511*a* after inversion and logical NAND between sftdot and negsftcut is carried out. Consequently, videopwm shown in the bottom row in FIG. 23 is produced, and the edge of a time T in sftdot in FIG. 21 is shifted by a time corresponding to half the period of the clock signal HSCLK. Thus, a part of LOW of sftdot is deleted partly, and edges corresponding to the trailing edges of the clock signal HSCLK are formed in videopwm.

Figure 24:
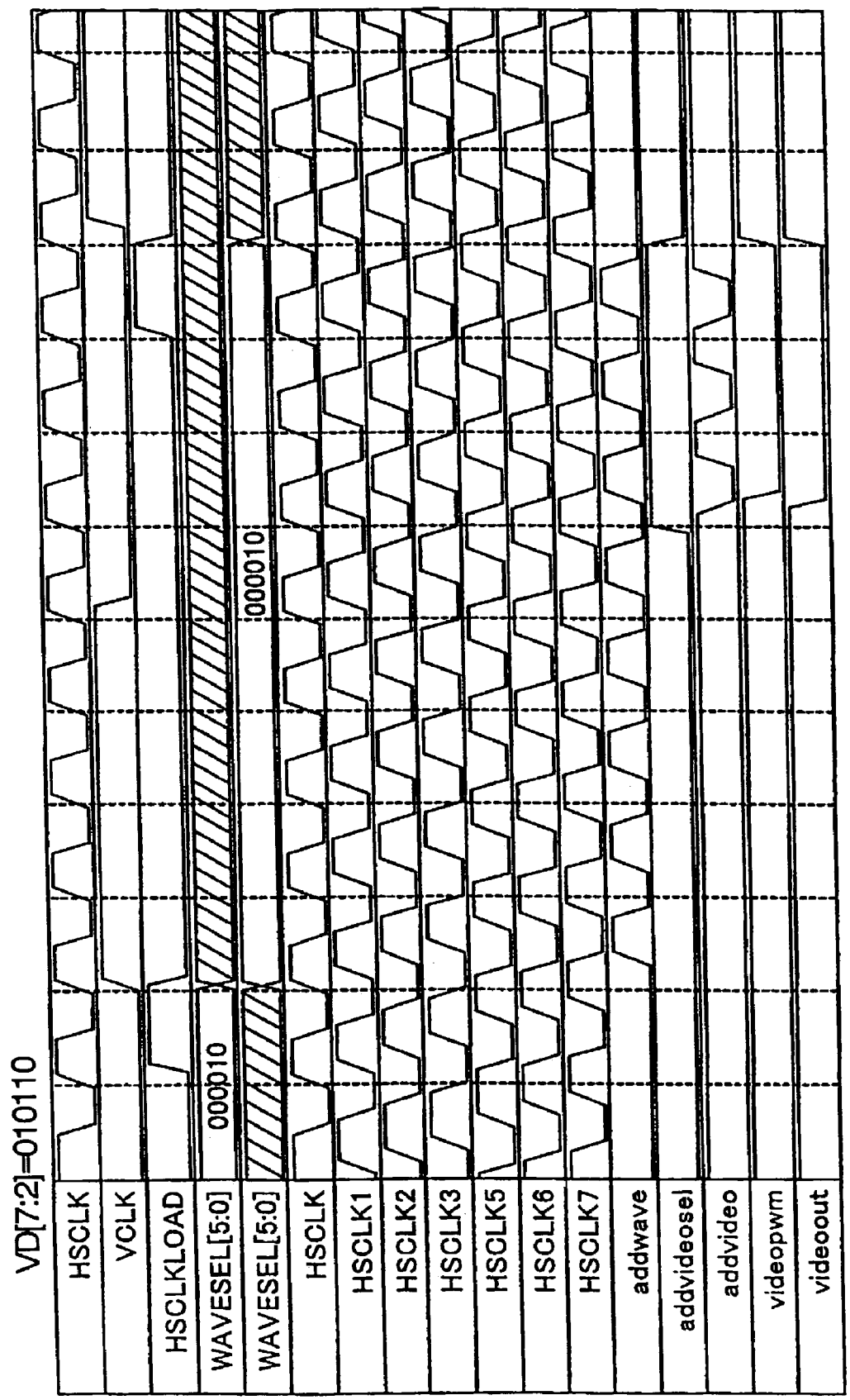
FIG. 24 is a diagram of assistance in explaining data provided by a delayed waveform generating circuit and a high-resolution serial data generating circuit.

Data provided by the delayed waveform generating circuit 52 and the high-resolution serial data generating circuit 53 when VD[7:2]=010110 will be described. FIG. 24 is a time chart of assistance in explaining signals when VD[7:2]=010110. While the laser printer 10 is in operation, HSCLKSET1 to HSCLKSET3 to be loaded to the register 54 in the foregoing manner are determined beforehand, and values of HSCLKSET1 to HSCLKSET3 are determined so that the edges of HSCLK1 to HSCLK3 appear every ¼ of half the period of the clock signal HSCLK as shown in FIG. 24.

The first delay circuit 520, the second delay circuit 521 and the third delay circuit 522 generates successive delayed pulses HSCLK1 to HSCLK3 continuously, the delayed pulses HSCLK1 to HSCLK3 are given to the selector unit 531 and, at the same time, the delayed pulses HSCLK1 to HSCLK3 are delayed by the delay unit 523 to generate HSCLK5 to HSCLK7. The signals HSCLK5 to HSCLK7 are given to the selector unit 531. Upon the reception of VD[7:2]=010110, the image processing module 41 provides WAVESEL[5:0]=000010 as shown in FIG. 17. when WAVESEL is loaded to the register 531*a*, a signal given to the NAND device 531*c* is able to pass the NAND device 531*c* and, consequently, HSCLK2 is used as addwave.

Since VD[7:4]=0101 in this embodiment, data addvideosel for one dot having a part of HIGH corresponding to three preceding clock pulses as shown in FIG. 19 is provided. Therefore, a signal addvideo is obtained by inverting HSCLK2 by the part corresponding to the preceding three clock pulses. FIG. 23, which is identical with FIG. 24, shows the corresponding videopwm, which is a signal formed by setting a part corresponding to preceding 2.5 clock pulses of the data for one dot to LOW. As mentioned above, HSCLK2 is delayed by a delay time corresponding to ½ of half the period of the clock signal HSCLK with respect to the leading edge of the clock signal HSCLK. Therefore, HSCLK2 is delayed by a delay time corresponding to ½ of half the period of the clock signal HSCLK with respect to the edge of videopwm. Thus, when addvideo and videopwm are given to the device 532*d*, the pulse width of the low level in videopwm is increased by a time corresponding to ½ of half the period of the clock signal HSCLK. A signal videoout is thus obtained. Thus, the pulse width can be controlled by pulse width in a high resolution in expressing the tone of a dot corresponding to eight clock pulses of the clock signal HSCLK.

Figure 25:
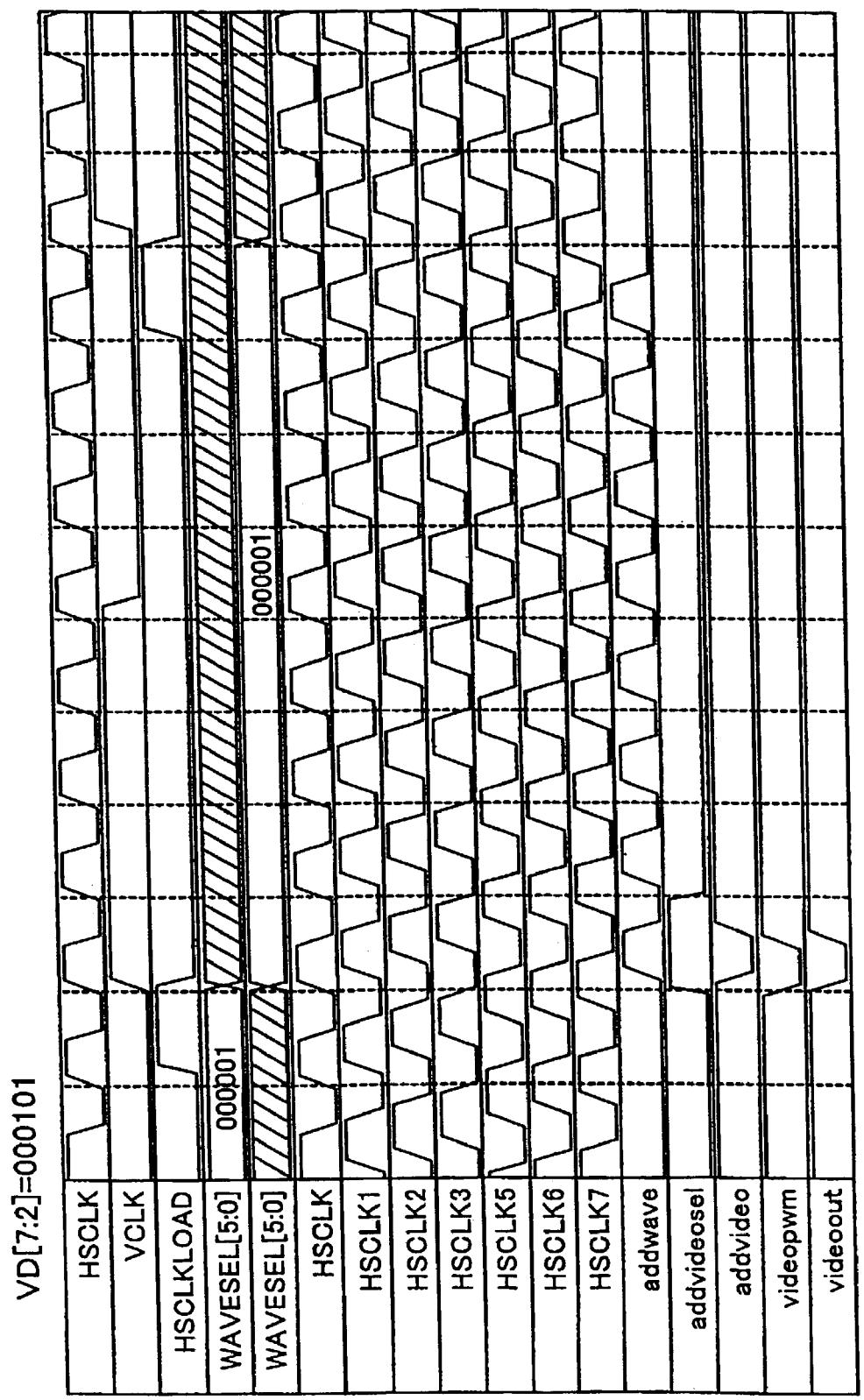
FIG. 25 is a diagram of assistance in explaining data provided by a delayed waveform generating circuit and a high-resolution serial data generating circuit.

Although VD[7:2]=010110 of the data structure shown in FIG. 4 has been described, high-resolution serial data pulses can be generated by the similar processes for other VDs. Modes of generating high-resolution serial data pulses for the data structures shown in FIGS. 3 and 5 are similar to that mentioned above. Further description will be made of VD[7:2]= 000101 of the data structure shown in FIG. 3. FIG. 25 is a time chart of assistance in explaining signals used when VD[7:2]=000101. Naturally, HSCLKSET1 to HSCLKSET3 to be loaded to the register 54 are determined beforehand, and each of HSCLK1 to HSCLK3 is delayed such that an edge appears every ¼ of half the period of the clock signal HSCLK as shown in FIG. 25.

Upon the reception of VD[7:2]=000101, the image processing module 41 provides WAVESEL[5:0]=000001 as shown in FIG. 17. When the WAVESEL is loaded to the register 531*a*, a signal given to the NAND device 531*b* passes the NAND device 531*b*, and HSCLK1 becomes addwave. Since VD[7:4]=0001 in this case, a signal addvideosel for one dot, having a part of HIGH corresponding to the last clock pulse is provided. Therefore, addvideo is a signal having inverted HSCLK1 corresponding to the last clock pulse. The corresponding videopwm for one dot, as shown in FIG. 9 (FIG. 25), is a signal having a part of LOW corresponding to the last 0.5 clock pulse.

Since HSCLK1 is delayed by a delay time corresponding to ¼ of half the period of the clock signal HSCLK with respect to the leading edge of the clock signal HSCLK, HSCLK1 is delayed also by a delay time corresponding to ¼ o half the period of the clock signal HSCLK from the edge f videopwm. Therefore, when addvideo and videopwm are given to the device 532*d*, the pulse width of a part of LOW of videopwm is increased by ¼ of half the period of the clock signal HSCLK. Thus, in the data structure shown in FIG. 3 also, the pulse width can be controlled by pulse width in a high resolution in expressing the tone of a dot corresponding to eight clock pulses of the clock signal HSCLK.

As apparent from the foregoing description, according to the present invention, the fundamental waveform is generated using the serial data synchronous with the leading and trailing edges, the delayed clock is generated at delayed times delayed by the delay device, and the fundamental waveform and the delayed clock are superposed. Thus, the low-cost pulse shaping system of a simple configuration is capable of achieving a necessary resolution without using any high-grade PLL circuit.

I claim:

1. A pulse shaping system, comprising:
   a read only memory that stores a set of parallel data;
   a register that loads the set of parallel data;
   a clock generator that outputs a clock signal;
   a clock signal delaying unit comprising a plurality of cascaded delay circuit units, each including an input terminal connected to a plurality of cascaded signal delay devices to obtain delayed pulses at a plurality of delayed times by delaying leading and trailing edges of an input signal to the input terminal;
   a delayed pulse gate that passes the delayed pulse selected by the set of parallel data which indicates a specific delayed pulse used during operation of the pulse shaping system from among said delayed pulses at said plurality of delayed times, and the delayed pulse gate outputs the delayed pulse from an output terminal, wherein
   said plurality of the cascaded delay circuit units are cascaded by connecting the output terminal of the delayed pulse gate of one of the cascaded delay circuit units with the input terminal of the clock signal delaying unit of the other of the cascaded delay circuit unit, and the clock signal is input to the input terminal of the clock signal delaying unit of the cascaded delay unit which lies firstly in the cascade comprising of the plurality of the cascaded delay circuits.

2. A pulse shaping system comprising:

a clock generator that outputs a clock signal;

a first parallel-to-serial converting unit capable of being triggered for operation by the leading edge or the trailing edge of the clock signal to convert first parallel data into an initial serial data pulse;

a second parallel-to-serial converting unit capable of being triggered for operation by the trailing edge of the clock signal if the first parallel-to-serial converting unit is triggered by the leading edge of the clock signal or by the leading edge of the clock signal if the first parallel-to-serial converting unit is triggered by the trailing edge of the clock signal to convert second parallel data into a pulse width adjusting serial data pulse;

a pulse width adjusting unit connected to the first parallel-to-serial converting unit and the second parallel-to-serial converting unit, and the pulse width adjusting unit adjusts the width of the initial serial data pulse between at least one of the edges of the initial serial data pulse and the edge of the pulse width adjusting serial data pulse, and provides a serial data pulse of a pulse width adjusted by the pulse width adjusting unit from a serial data output unit;

a read only memory that stores a set of parallel data;

a register that loads the set of parallel data;

a clock signal delaying unit comprising a plurality of cascaded delay circuit units, each including an input terminal connected to a plurality of cascaded signal delay devices to obtain delayed pulses at a plurality of delayed times by delaying leading and a trailing edges of an input signal to the input terminal; a delayed pulse gate that passes the delayed pulse selected by the set of parallel data which indicates a specific delayed pulse used during operation of the pulse shaping system from among said delayed pulses at said plurality of delayed times, and the delayed pulse gate outputs the delayed pulse from an output terminal, wherein;

said plurality of the cascaded delay circuit units are cascaded by connecting the output terminal of the delayed pulse gate of one of the cascaded delay circuit units with the input terminal of the clock signal delaying unit of the other of the cascaded delay circuit units, and the clock signal is input to the input terminal of the clock signal delaying unit of the cascaded delay unit which lies firstly in the cascade comprising of the plurality of the cascaded delay circuits;

a selector unit connected to each of the output terminal of the delayed pulse gate of the plurality of the cascaded delay circuit units, the selector unit passes one of the delayed pulse output from the output terminal; and a high-resolution serial data pulse signal output unit connected to the serial data output unit and the selector unit, the high-resolution serial data pulse signal output unit provides a high-resolution serial data pulse formed by adjusting the pulse width of the serial data pulse between at least one of the edges of the serial data pulse provided by the serial data output unit and the edge of the delayed pulse selected by the selector unit.

3. The pulse shaping system according to claim 2, wherein the high-resolution serial data pulse is used for adjusting width of a laser beam in a scanning direction of a laser printer.

4. The pulse shaping system according to claim 2, wherein the second parallel-to-serial converting unit includes a shift register driven by either the leading or the trailing edge, and a flip-flop capable of latching an output of the shift register and driven by the leading edge when the shift register is driven by the trailing edge or by the trailing edge when the shift register is driven by the leading edge.

5. The pulse shaping system according to claim 2, wherein the cascaded signal delay devices are buffers provided with an even number of inverters.

6. The pulse shaping system according to claim 2, wherein the set of parallel data specifies the delayed pulse by setting each of bits to an ON state or an OFF state.

7. The pulse shaping system according to claim 2, wherein, a time interval between the most delayed signal delayed by the cascaded signal delay devices and a nondelayed signal is less than or equal to $3/2$ of a necessary delay time of the delayed pulse.

8. A pulse shaping method, comprising:

outputting a clock signal;

triggering a first parallel-to-serial converting unit by the leading edge or the trailing edge of the clock signal to convert first parallel data into an initial serial data pulse;

triggering a second parallel-to-serial converting unit by the trailing edge of the clock signal if the first parallel-to-serial converting unit is triggered by the leading edge of the clock signal or by the leading edge of the clock signal if the first parallel-to-serial converting unit is triggered by the trailing edge of the clock signal to convert second parallel data into a pulse width adjusting serial data pulse;

adjusting the width of the initial serial data pulse between at least one of the edges of the initial serial data pulse and the edge of the pulse width adjusting serial data pulse;

providing a serial data pulse of an adjusted pulse width;

storing a set of parallel data;

loading the set of parallel data;

selecting a delayed pulse according to the set of parallel data, where the set of parallel data is loaded before operation of the pulse shaping;

obtaining delayed pulses at a plurality of delayed times by delaying a leading and a trailing edge of an input signal to an input terminal connected to a plurality of cascaded signal delay devices;

passing the delayed pulse selected by the set of parallel data, which indicates a specific delayed pulse used during pulse shaping from among said delayed pulses at said plurality of delayed times, and outputting the delayed pulse from an output terminal;

applying the delayed pulse output from the output terminal to an input terminal of an (n+1)th stage clock signal delaying unit of an (n+1)th stage delay circuit; and providing a high-resolution serial data pulse formed by adjusting the pulse width of the serial data pulse between at least one of the edges of the serial data pulse and the edge of the delayed pulse selected by the set of parallel data.

* * * * *